United States Patent
Fukami

(10) Patent No.: US 8,717,058 B2
(45) Date of Patent: May 6, 2014

(54) SEMICONDUCTOR APPARATUS AND METHOD OF DETECTING CHARACTERISTIC DEGRADATION OF SEMICONDUCTOR APPARATUS

(75) Inventor: Ikuo Fukami, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 428 days.

(21) Appl. No.: 12/886,115

(22) Filed: Sep. 20, 2010

(65) Prior Publication Data

US 2011/0068818 A1    Mar. 24, 2011

(30) Foreign Application Priority Data

Sep. 24, 2009  (JP) .................................. 2009-218824

(51) Int. Cl.
  *G01R 31/02* (2006.01)
(52) U.S. Cl.
  USPC ............ 324/762.01; 324/762.02; 324/762.03; 324/762.05; 324/762.08; 324/762.09; 324/762.1
(58) Field of Classification Search
  USPC ......................................... 324/762.01–762.1
  See application file for complete search history.

(56) References Cited

U.S. PATENT DOCUMENTS

| | | | | |
|---|---|---|---|---|
| 5,486,772 A | * | 1/1996 | Hshieh et al. | ............ 324/762.09 |
| 6,011,416 A | * | 1/2000 | Mizuno et al. | ................ 327/108 |
| 6,222,355 B1 | * | 4/2001 | Ohshima et al. | ............... 323/282 |
| 7,504,849 B2 | * | 3/2009 | Ohshima | ................... 324/764.01 |
| 7,856,332 B2 | * | 12/2010 | Karthikeyan et al. | ........... 702/85 |
| 2005/0258805 A1 | * | 11/2005 | Thomas et al. | ................ 320/134 |
| 2009/0143999 A1 | | 6/2009 | Karthikeyan et al. | |
| 2011/0085275 A1 | * | 4/2011 | Ohshima | ...................... 361/93.7 |

FOREIGN PATENT DOCUMENTS

| | | |
|---|---|---|
| CN | 1265539 A | 9/2000 |
| JP | 9-127186 A | 5/1997 |
| JP | 2599788 Y2 | 7/1999 |
| JP | 2000-230961 A | 8/2000 |
| JP | 2002-230961 A | 8/2000 |
| JP | 2002-5989 A | 1/2002 |
| JP | 2003-70231 A | 3/2003 |
| JP | 2007-174756 A | 7/2007 |

OTHER PUBLICATIONS

NEC Electronics, Data Sheet of MOS Integrated Circuit (μ PD166005), <URL:http://www.eu.necel.com/_pdf/S19284EJ1V0DS00.PDF>, Jul. 2008, 15 pages.

* cited by examiner

*Primary Examiner* — Hezron E Williams
*Assistant Examiner* — Hoang Nguyen
(74) *Attorney, Agent, or Firm* — Foley & Lardner LLP

(57) ABSTRACT

A semiconductor apparatus (IPD) includes a set value storage unit that stores a set value determined based on an initial characteristic value of the IPD, and a detector that detects characteristic degradation of the IPD based on a characteristic value of the IPD at given timing and the set value stored in the set value storage unit. Further, a method of detecting characteristic degradation of a semiconductor apparatus (IPD) includes storing a set value determined based on an initial characteristic value of the IPD, and detecting characteristic degradation of the IPD based on a characteristic value of the IPD at given timing and the stored set value.

10 Claims, 30 Drawing Sheets

GATE LEAKAGE DETECTOR

50

CONSUMPTION CURRENT DETECTOR

US 8,717,058 B2

SEMICONDUCTOR APPARATUS AND METHOD OF DETECTING CHARACTERISTIC DEGRADATION OF SEMICONDUCTOR APPARATUS

INCORPORATION BY REFERENCE

This application is based upon and claims the benefit of priority from Japanese patent application No. 2009-218824, filed on Sep. 24, 2009, the disclosure of which is incorporated herein in its entirety by reference.

BACKGROUND

1. Field of the Invention

The present invention relates to a semiconductor apparatus and a method of detecting characteristic degradation of a semiconductor apparatus and, particularly, to a semiconductor apparatus and a method of detecting characteristic degradation of a semiconductor apparatus that detect characteristic degradation of a semiconductor apparatus which is a so-called intelligent power device (IPD).

2. Description of Related Art

A power MOSFET is one of devices capable of handling a large power. The power MOSFET has a feature such as a higher switching speed than other power devices.

Japanese Unexamined Patent Application Publication No. 2007-174756 discloses an on-failure detection apparatus of a power supply circuit that can protect the power supply circuit by detecting a sign of an on-failure of a semiconductor device (power MOSFET) which is used as a switching device that switches between on and off of the power supply circuit and turning off the semiconductor device at the point of time before a breaking function of the circuit is disabled. According to the technique disclosed in Japanese Unexamined Patent Application Publication No. 2007-174756, an on-failure caused by a dielectric breakdown can be detected in advance by placing a gate resistor at the gate of the power MOSFET and measuring a voltage drop of the gate resistor when the power MOSFET is on.

Further, Japanese Utility Model No. 2599788 discloses a technique related to a failure detector that can perform failure identification even when a power MOSFET is in a semi-failure state. According to the technique disclosed in Japanese Utility Model No. 2599788, in a switching module using a power MOSFET, two comparators that compare output voltages are placed separately, a means of determining that the power MOSFET is normally off and a means of determining that the power MOSFET is normally on are placed independently, and a failure identification circuit that receives the respective determination signals and identifies a failure is placed.

Further, "MOS Integrated Circuit (μPD166005) data sheet (NEC Electronics)" <URL:http://www.eu.necel.com_pdf/S19284EJ1V0DS00.PDF> discloses an intelligent power device (IPD). FIG. 25 is a view showing an exemplary circuit that incorporates the IPD disclosed in the document. An IPD 101 is placed between a VCC terminal 103 and a GND (ground) terminal, receives a signal output from an output terminal 108 of a controller 102 at an input terminal 106, and controls a load 109 which is connected to an output terminal 104. Further, the IPD 101 has a self-diagnosis function, and outputs a result of self-diagnosis to an input terminal 107 of the controller 102 through a DIAG terminal 105.

FIG. 26 is a detailed circuit diagram of the IPD 101 disclosed in the above "MOS Integrated Circuit (μPD166005) data sheet (NEC Electronics)". The IPD 101 processes a signal received at the input terminal 106 by a logic 113 and controls a power MOSFET 110. In the power MOSFET 110, a drain is connected to a power supply terminal (VCC) 103, and a source is connected to the output terminal 104. A current that flows to the load 109 which is connected to the output terminal 104 is controlled by the power MOSFET 110. Further, the IPD 101 has a self-diagnosis function such as an over-current detector 111, an over-temperature sensor 112 or the like, and upon reaching a preset criterion, it can cut off the power MOSFET 110 and feed back the information as a self-diagnosis result to the controller 102 through the DIAG terminal 105. An operation when the over-current detector 111 and the over-temperature sensor 112 work is described hereinbelow.

First, a case where the over-current detector 111 operates in a load short circuit condition is described. FIG. 27A is a view showing a change in the output current of a power MOSFET when the power MOSFET turns on and then a load short circuit occurs. When a load short circuit occurs, an over-current exceeding the current rating flows to the power MOSFET, and the power MOSFET is broken by heat. Generally, a current limiter that avoids an over-current from flowing is placed in the IPD. By using the current limiter, an over-current can be suppressed to some level as shown in FIG. 27B. However, the heat increases with time in this case also, which leads to a breakdown of the power MOSFET.

To avoid this, the IPD shown in FIG. 26 includes the over-current detector 111. The over-current detector 111 has a function of cutting off the power MOSFET when a current flowing through the power MOSFET exceeds a current detection threshold which is preset to the IPD as shown in FIG. 27C. The function prevents a breakdown of the power MOSFET due to heat.

FIG. 28 is a view showing an example of the over-current detector 111. The over-current detector 111 includes a comparator 116, and a potential of the output terminal 104 is supplied to one input of the comparator 116, a current detection threshold 115 is supplied to the other input, and an output of the comparator 116 is input to the logic 113. When the on-resistance of the power MOSFET 110 is 100 mΩ and the current rating is 2 A, the current detection threshold is designed to 0.5V (=100 mΩ×5 A), for example. In such conditions, when the output current of the power MOSFET exceeds 5 A, a driver 114 is controlled by a logic 113, so that the power MOSFET 110 is cut off.

Next, a case where the over-temperature sensor 112 operates in a load short circuit condition is described. FIG. 29A is a view showing a change in the output current of a power MOSFET when the power MOSFET turns on and then a load short circuit occurs, and a temperature change of the power MOSFET. When a load short circuit occurs, a current exceeding the current rating flows to the power MOSFET, and the power MOSFET is broken by heat. Generally, a current limiter that avoids an over-current from flowing is placed in the IPD. By using the current limiter, an over-current can be suppressed to some level as shown in FIG. 29B. However, the heat increases with time in this case also, which leads to a breakdown of the power MOSFET.

To avoid this, the IPD shown in FIG. 26 includes the over-temperature sensor 112. The over-temperature sensor 112 has a function of cutting off the power MOSFET when the temperature of the power MOSFET exceeds a temperature detection threshold which is preset to the IPD as shown in FIG. 29C. The function prevents a breakdown of the power MOSFET due to heat.

FIG. 30 is a view showing an example of the over-temperature sensor 112. The over-temperature sensor 112 includes a comparator 118, and a voltage drop of a diode 119 which is thermally coupled to the power MOSFET is supplied to one input of the comparator 118, a temperature detection threshold 117 is supplied to the other input, and an output of the comparator 118 is input to the logic 113. A cathode of the diode 119 is connected to a constant current source 120. When the voltage drop of the diode 119 at 27° C. is 0.7 V, a temperature change is −2 mV/° C., and the temperature rating is 150° C., the temperature detection threshold is designed to 0.404 V (=0.7V-2 mV/° C.×(175° C.-27° C.)). In such conditions, when the temperature of the power MOSFET exceeds 175° C., a driver 114 is controlled by a logic 113, so that the power MOSFET 110 is cut off.

In this manner, in the IPD shown in FIG. 26, the over-current detector 111 and the over-temperature sensor 112 operate independent of each other, and a breakdown of the power MOSFET can be avoided under abnormal conditions.

SUMMARY

A failure of a power MOSFET and a semiconductor apparatus (IPD) incorporating the power MOSFET is described firstly. FIG. 11 is a view showing a change in the failure rate of the IPD with the lapse of time. As shown in FIG. 11, a failure of the IPD can be divided into an early failure period, a random failure period and a wear-out failure period in order of time. Further, FIG. 12 is a view showing a change in the characteristic value of the IPD with the lapse of time. As shown in FIG. 12, in the IPD which has undergone abnormal conditions such as surge is likely to suffer a failure earlier than the IPD which has not undergone abnormal conditions (the IPD which has reached the end of its life). In the present invention, there is provided a semiconductor apparatus (IPD) capable of preventing a failure in the random failure period in FIG. 11 or a failure just before a change of characteristics (the point A and the point B in the figure) in FIG. 12 from occurring.

There are four failure cases of the IPD: (1) a failure due to an increase in the on-resistance of the power MOSFET, (2) a failure due to an increase in the leakage current of the power MOSFET, (3) a failure due to an increase in the gate leakage current of the power MOSFET, and (4) a failure due to a change in the consumption current of the IPD which includes the power MOSFET. The respective failure cases are described hereinbelow.

(1) Failure due to Increase in On-resistance of Power MOSFET

First, a failure due to an increase in the on-resistance of the power MOSFET is described. FIG. 13 is a view showing a state where an over-current flows to the power MOSFET due to a load short circuit or the like. As shown in FIG. 13, as a result that an over-current flows to the power MOSFET, electromigration occurs at the interface between metal and semiconductor of the power MOSFET. FIGS. 14, 15 and 16 are views to describe electromigration which occurs in the power MOSFET. As shown in FIG. 14, as a result that a large current flows to the power MOSFET, electromigration occurs at the interface between metal and semiconductor, and the resistance of the power MOSFET increases.

As shown in FIG. 15, if the electromigration grows larger, its effect is exerted on a resistance component of a base region of a power MOSFET cell. Consequently, as shown in FIG. 16, a parasitic bipolar transistor of the power MOSFET operates, and particularly, current concentration occurs in a cell which is most affected by turn-off by switching, among cells constituting the power MOSFET. Due to the current concentration caused by the parasitic bipolar transistor, a particular cell is heated suddenly, which results in a failure of the power MOSFET. This case is where, although a change in the on-resistance of the power MOSFET is small, an increase in the on-resistance instantaneously makes the power MOSFET fail.

(2) Failure due to Increase in Leakage Current of Power MOSFET

FIG. 17 is a view showing a case where the width of a source diffusion region ($N^+$) becomes larger due to manufacturing variations of the power MOSFET. In the power MOSFET in which the width of the source diffusion region is large, because the effective channel length of the power MOSFET is short, if a drain-source voltage increases, a larger current flows compared to another cell as shown in FIG. 18. Therefore, when a load is an actuator such as a solenoid, a high voltage is generated as a drain-source voltage of the power MOSFET by turn-off in the switching of the power MOSFET due to an inductance component of the load. Consequently, an unexpectedly large current flows to the power MOSFET at every switching occasion.

At this time, as shown in FIG. 19, there is a case where electrons passing through the relevant cell give rise to impact ionization, and positive charges are trapped into a gate oxide film of the power MOSFET. When positive charges are trapped into the gate oxide film, a leakage current is generated in the cell, and a larger current than in another cell flows thereto (feed-forward phenomenon). In the end, an excessive current which cannot be covered in the cell is concentrated, and the cell is heated all of a sudden, which leads to a failure. This case is where, although the total leakage current of the power MOSFET is small, concentration of a current on a particular cell instantaneously makes the power MOSFET fail.

(3) Failure due to Increase in Gate Leakage Current of Power MOSFET

A case where a surge voltage is applied to the power MOSFET, and a leakage point occurs in the gate oxide film of the power MOSFET is considered next. FIG. 20 is a view showing a case where a leakage point occurs between a gate and a source due to surge voltage application. In the power MOSFET, a plurality of unit structures called cells are connected in parallel as shown in FIG. 21. Even when a leakage point occurs between the gate and the source of one of those cells due to surge voltage application, if the value of leakage is small, i.e. if the current supply capacity of the driver is greater for the leakage current, the operation of the power MOSFET is not affected.

However, when a voltage continues to be applied between the gate and the source (the on-state of the power MOSFET), the amount of current in the leakage point increases suddenly, and an irreversible transition occurs in some cases. The occurrence of the irreversible transition affects the operation of the power MOSFET and causes a so-called off-failure, in which the power MOSFET does not become the on-state in spite of application of a gate-source voltage.

Next, a case where a leakage point is between a gate and a drain is described. FIG. 22 shows a case where a leakage point occurs between a gate and a drain due to surge voltage application. As described above, in the power MOSFET, a plurality of unit structures called cells are connected in parallel as shown in FIG. 23. Even when a leakage point occurs between the gate and the drain of one of those cells due to surge voltage application, if the value of leakage is small, i.e. if the current supply capacity of the driver is greater for the leakage current, the operation of the power MOSFET is not affected.

However, when a voltage continues to be applied between the gate and the drain (the on-state of the power MOSFET), the amount of current in the leakage point increases suddenly, and an irreversible transition occurs in some cases. The occurrence of the irreversible transition affects the operation of the power MOSFET and causes a so-called on-failure, in which the power MOSFET does not become the off-state.

These cases are where, although the gate leakage current of the power MOSFET is small, a sudden increase in current causes a failure that makes the power MOSFET uncontrollable.

(4) Failure due to Change in Consumption Current of IPD

A case where there is a remaining line pattern between line patterns (between a line 1 and a line 2) of the controller of the IPD is considered as shown in FIG. 24. It is assumed that, in a check at the manufacturing stage of the IPD, the line 1 and the line 2 are electrically open, and the check has been passed. However, during the subsequent IPD operation, when the remaining line pattern expands and contracts due to a change in environmental temperature, for example, and the line 1 and the line 2 are electrically short-circuited having a resistance component, a current flows between the line 1 and the line 2. FIG. 24B is a circuit diagram showing such a state.

In this case, because the remaining line pattern has a high resistance, fluctuations of the total consumption current of the IPD are small and do not exert any effect on the operation of the IPD. However, if the IPD keeps operating, the resistance of the remaining line pattern becomes lower, and the effect is suddenly exerted on the IPD. By the effect, the IPD becomes uncontrollable, and it is determined as a failure. This case is where, although an increase and a decrease in the total consumption current of the IPD is small, the fluctuations of the resistance component of the remaining line pattern lead to a sudden failure.

As described in the above four failure cases, up to a failure of the IPD, there is a small change in the on-resistance of the power MOSFET, the leakage current (gate leakage, off-leakage) and the consumption current of the IPD, and then a sudden change occurs in such values, so that a failure occurs. Thus, in order to prevent a failure in the random failure period from occurring or avoid a failure of the IPD which has undergone abnormal conditions such as surge due to the subsequent degradation progress, it is necessary to monitor a small change in the on-resistance of the power MOSFET, the leakage current, and the consumption current of the IPD described above.

Further, as described above, the IPD shown in FIGS. 25 and 26 includes the over-current detector and the over-temperature sensor in order to protect the power MOSFET from abnormal conditions. However, when a state transition occurs suddenly in the IPD and the function of the IPD is degraded, the over-current detector and the over-temperature sensor cannot sufficiently protect the IPD.

For example, assume a case where the load is short-circuited as an abnormal condition. As described above, even when a current flowing to the power MOSFET is limited by the current limiter upon the short circuit of the load, a large current exceeding the rating flows to the power MOSFET temporarily. Due to the large current, electromigration occurs in some cells with a high current density among the cells constituting the power MOSFET. Further, the electromigration proceeds during the operation of the IPD, and the output on-resistance becomes slightly higher as the IPD characteristics.

For example, it is assumed that there are 15000 cells that constitute the power MOSFET of the IPD, and a resistance value increases due to electromigration in 1000 cells among them. In this case, when it becomes the open state, i.e. when the resistance value becomes infinite, the on-resistance of the power MOSFET of the IPD becomes 15000/14000 times. Specifically, when the on-resistance at the initial stage of manufacture is 100 mΩ, the on-resistance by the electromigration is 107.143 mΩ.

In this case, if the subsequent operation of the IPD is within the rating, e.g. if an output current is within 2 A, a voltage drop of the power MOSFET is 214.286 mV at maximum, and the above-described over-current detector does not work as a matter of course (when the threshold of over-current detection is 500 mV). Further, as for the over-temperature sensor also, because the use conditions of the IPD are set to 100° C., for example, by providing a sufficient margin to the temperature rating (e.g. 150° C.) in normal operation, the over-temperature sensor also does not work (when the threshold of over-temperature detection is 175° C.).

However, as described in "(1) Failure due to Increase in On-resistance of Power MOSFET" in the above-described failure cases of the IPD, with the electromigration in the cell of the power MOSFET, the parasitic bipolar transistor operates by switching, particularly turn-off, of normal operation. Due to the current concentration caused by the parasitic bipolar transistor, a particular cell is heated suddenly, and a failure occurs in the power MOSFET. In this manner, the power MOSFET can suddenly reach a breakdown due to an abrupt state transition. Therefore, the over-current detector and the over-temperature sensor included in the IPD described in the background art cannot deal with the abrupt state transition, and there is thus a problem that a failure occurs in the IPD in some cases.

A first exemplary aspect of the present invention is a semiconductor apparatus which includes a set value storage unit that stores a set value determined based on an initial characteristic value of the semiconductor apparatus, and a detector that detects characteristic degradation of the semiconductor apparatus based on a characteristic value of the semiconductor apparatus at given timing and the set value stored in the set value storage unit.

Because the semiconductor apparatus according to the exemplary aspect of the present invention can detect characteristic degradation which leads to a failure of the semiconductor apparatus based on a set value determined based on an initial characteristic value of the semiconductor apparatus and a characteristic value of the semiconductor apparatus at given timing, it is possible to prevent a failure of the semiconductor apparatus from occurring.

A second exemplary aspect of the present invention is a method of detecting characteristic degradation of a semiconductor apparatus which includes storing a set value determined based on an initial characteristic value of the semiconductor apparatus, and detecting characteristic degradation of the semiconductor apparatus based on a characteristic value of the semiconductor apparatus at given timing and the stored set value.

Because the method of detecting characteristic degradation of a semiconductor apparatus according to the exemplary aspect of the present invention can detect characteristic degradation which leads to a failure of the semiconductor apparatus based on a set value determined based on an initial characteristic value of the semiconductor apparatus and a characteristic value of the semiconductor apparatus at given timing, it is possible to prevent a failure of the semiconductor apparatus from occurring.

According to the exemplary aspects of the present invention described above, it is possible to provide a semiconductor apparatus and a method of detecting characteristic degradation of a semiconductor apparatus that can detect characteristic degradation which leads to a failure of the semiconductor apparatus.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 27A is a case without a current limiter and an over-current detector, FIG. 2713 is a case with a current limiter, and FIG. 27C is a case with a current limiter and an over-current detector;

FIG. 29A is a case without a current limiter and an over-current detector, FIG. 29B is a case with a current limiter, and FIG. 29C is a case with a current limiter and an over-current detector.

DETAILED DESCRIPTION OF THE EXEMPLARY EMBODIMENTS

First Exemplary Embodiment

Figure 1:
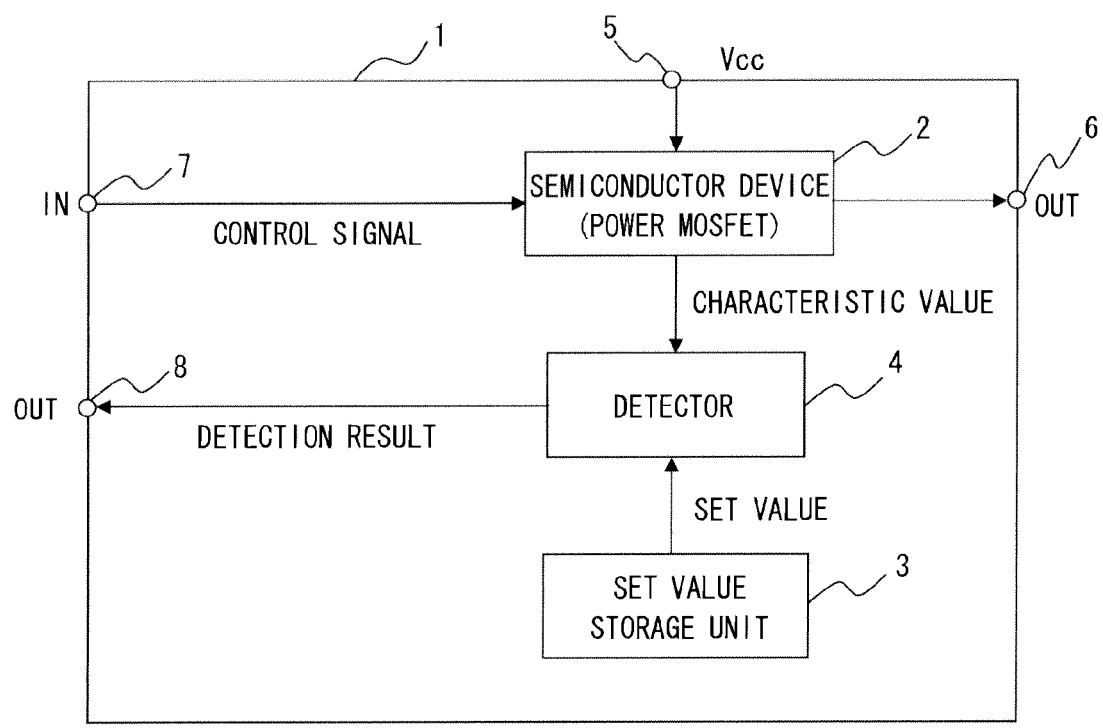
FIG. 1 is a block diagram showing a semiconductor apparatus (IPD) according to a first exemplary embodiment.

A first exemplary embodiment of the present invention is described hereinafter with reference to the drawings. FIG. 1 is a block diagram showing an IPD (semiconductor apparatus) 1 according to the exemplary embodiment. The IPD 1 according to the exemplary embodiment is manufactured by a semiconductor manufacturing process, and the IPD 1 includes a set value storage unit 3 that stores a set value which is determined based on an initial characteristic value of the IPD 1 in the state where a semiconductor chip (or wafer) is completed, and a detector 4 that detects the characteristic degradation of the IPD 1 based on a characteristic value of the IPD 1 at given timing in the state where the IPD 1 is implemented in a system such as an engine control unit (ECU) and the set value stored in the set value storage unit 3.

A power semiconductor device which is included in the IPD 1 according to the exemplary embodiment is a power MOSFET 2, for example. The power MOSFET 2 is an N-type power MOSFET, for example, in which a drain is connected to a power supply terminal (Vcc) 5, a source is connected to an output terminal (OUT) 6, and a gate is connected to an input terminal (IN) 7. A control signal is supplied to the gate of the power MOSFET 2. Note that, in the semiconductor apparatus 1 according to the exemplary embodiment, a driver may be placed between the power MOSFET 2 and the input terminal 7. Further, a load is connected to the output terminal 6. The power semiconductor device is not limited to the power MOSFET, and it may be an insulated gate bipolar transistor (IGBT).

In the IPD 1 according to the exemplary embodiment, the detector 4 may be a circuit for detecting the characteristic degradation of an on-resistance of the power MOSFET 2, a circuit for detecting the characteristic degradation of a gate leakage of the power MOSFET 2, a circuit for detecting the characteristic degradation of an off-leakage of the power MOSFET 2, and a circuit for detecting the characteristic degradation (voltage drop) of a consumption current flowing to the IPD 1, for example. Note that, besides those, any value may be used as long as it is a characteristic value which can be used for detecting the characteristic degradation of an IPD in this exemplary embodiment.

Further, in the IPD 1 according to the exemplary embodiment, a detection result is output from the detector 4, and the detection result is output from an output terminal 8. Specifically, when the detector 4 detects abnormality, a signal notifying abnormality is output from the output terminal 8, and when the detector 4 does not detect abnormality, a signal notifying normality is output from the output terminal 8. When the signal notifying abnormality is output from the output terminal 8, a controller (a microcomputer 10 in FIG. 2) that controls the IPD 1 displays a message notifying the necessity of exchanging the IPD 1, changes a control parameter of the IPD 1, or stops the operation of the IPD 1, for example.

Further, the characteristic value of the IPD 1 at given timing which is used when the detector 4 detects the characteristic degradation of the IPD 1 may be a characteristic value at power-on of the IPD 1, a characteristic value at timing when a control signal is input to the input terminal 7 of the IPD 1, a characteristic value at timing when an instruction signal for detecting the characteristic degradation of the IPD 1 is input from the controller to the IPD 1, a characteristic value at regular time intervals during the operation of the IPD 1 or the like, for example. Note that, besides those, the given timing to acquire the characteristic value of the IPD 1 may be set arbitrarily.

Figure 2:
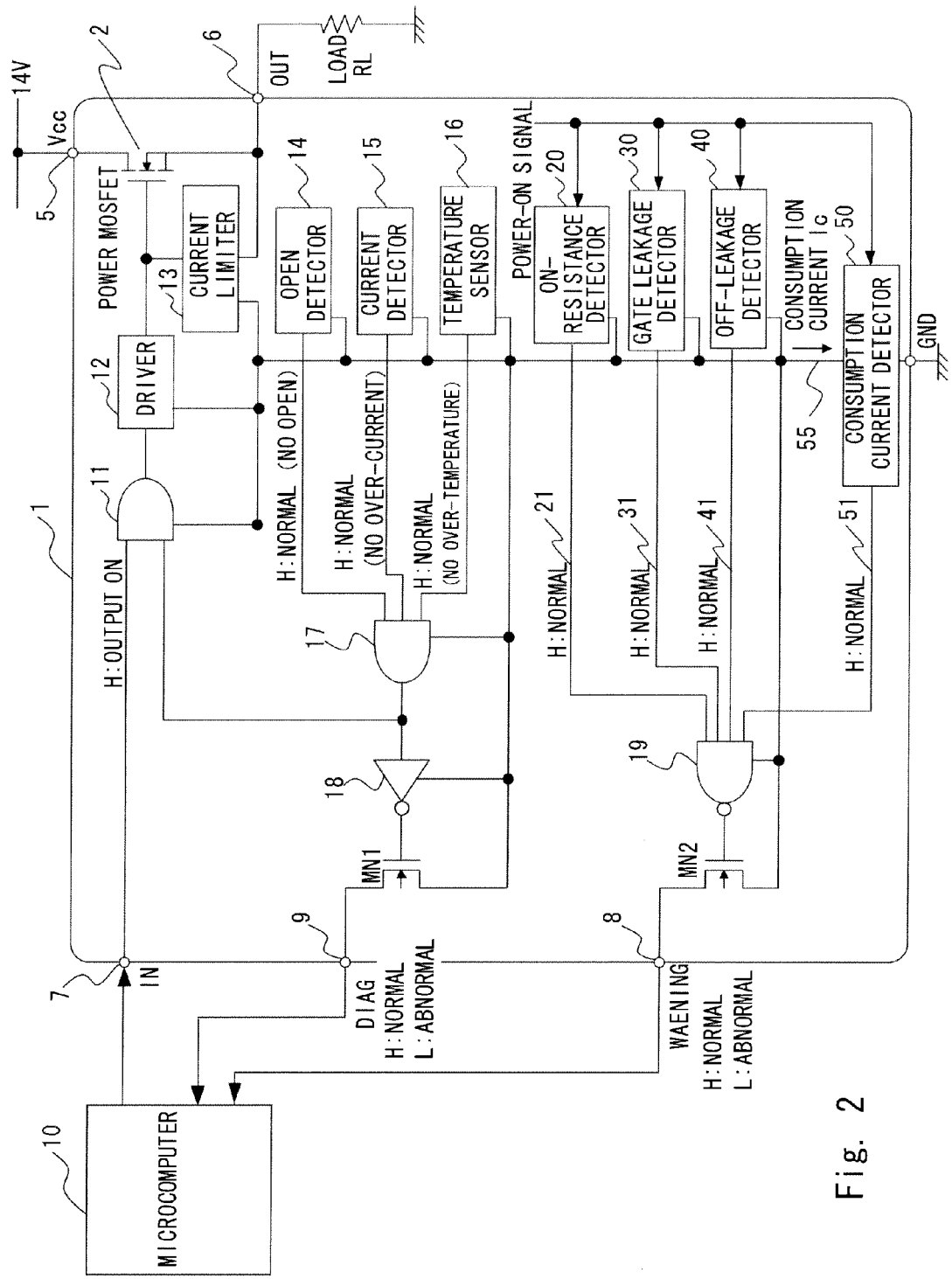
FIG. 2 is a block diagram to describe the detail of the semiconductor apparatus (IPD) according to the first exemplary embodiment.

A detailed configuration of the IPD (semiconductor apparatus) according to the exemplary embodiment is described hereinafter with reference to FIG. 2. FIG. 2 is a block diagram showing a detailed configuration of the IPD 1 according to the exemplary embodiment. The IPD 1 according to the exemplary embodiment includes the power MOSFET 2, a driver 12, a current limiter 13, an open detector 14, a current detector 15, a temperature sensor 16, and a DIAG output terminal 9.

The drain of the power MOSFET 2 is connected to the power supply terminal (Vcc) 5, the gate is connected to the driver 12, and the source is connected to the output terminal (OUT) 6. Further, the current limiter 13 is connected between the gate and the source of the power MOSFET 2. A load RL is connected to the output terminal (OUT) 6, and the power MOSFET 2 supplies a current to the load RL. Further, the driver 12 is a circuit for driving the power MOSFET 2.

The current limiter 13 is a circuit that limits an output current in order to prevent the degradation and breakdown of the power MOSFET 2 caused by an over-current flowing to the power MOSFET 2 due to abnormal conditions, such as a load short circuit in which the output terminal 6 and the GND terminal of the load are short-circuited, for example. When the current limiter 13 is not implemented, an over-current of 100 A or more, for example, flows to the power MOSFET 2. However, by incorporating the current limiter 13, a current flowing to the power MOSFET 2 can be limited to 15 A or so.

The open detector 14 is a circuit that detects the open state of the output terminal (OUT) 6. Specifically, the open detector 14 is a circuit for detecting the state where the load RL, which should be connected to the output terminal 6, is not connected thereto.

The current detector 15 is a circuit that detects whether a current exceeding the current rating flows to the power MOSFET 2. For example, when the current rating of the power MOSFET 2 is 2 A, current detection is made when a current of 15 A flows to the power MOSFET 2 due to some kind of abnormality (e.g. the above-described load short circuit).

The temperature sensor 16 is a circuit that detects abnormality when the temperature of the power MOSFET 2 exceeds a preset temperature (e.g. 175° C.) due to an abnormal condition (e.g. the above-described load short circuit).

The respective outputs of the open detector 14, the current detector 15 and the temperature sensor 16 are supplied to an AND circuit 17. Then, when the outputs of the open detector 14, the current detector 15 and the temperature sensor 16 are all H level (High level, normal), the AND circuit 17 outputs an H level signal to an inverter 18 and an AND circuit 11. The inverter 18 inverts the H level signal from the AND circuit 17 to an L level (Low level) signal and supplies the L level signal to the gate of an N-type MOS transistor MN1. In this case, because the gate of MN1 is L level, an H level signal which indicates normality is output from the DIAG output terminal 9.

On the other hand, when any of the outputs of the open detector 14, the current detector 15 and the temperature sensor 16 is L level (abnormal), the AND circuit 17 outputs an L level signal to the inverter 18. The inverter 18 inverts the L level signal from the AND circuit 17 to an H level signal and supplies the H level signal to the gate of the N-type MOS transistor MN1. Because the gate of MN1 is H level, an L level signal which indicates abnormality is output from the DIAG output terminal 9.

Specifically, a signal notifying abnormality is output from the DIAG output terminal 9 to the controller (microcomputer) 10 in any one or more of the cases where the open detector 14 detects the state in which the load is not connected to the output terminal (OUT) 6, where the current detector 15 detects the state in which an over-current is flowing, and where the temperature sensor 16 detects the state in which an over-temperature is occurring.

Further, the controller (microcomputer) 10 that controls the IPD 1 outputs a control signal for tuning on/off the IPD 1 to the input terminal (IN) 7 of the IPD 1. The control signal is supplied to the AND circuit 11 of the IPD 1. Further, the output from the AND circuit 17 is also supplied to the AND circuit 11. Thus, when the signal from the microcomputer 10 is H level and the signal from the AND circuit 17 is H level, the AND circuit 11 outputs an H level signal to the driver 12. On the other hand, when at least one of the signal from the microcomputer 10 and the signal from the AND circuit 17 is L level, the AND circuit 11 outputs an L level signal to the driver 12. The driver 12 drives the power MOSFET 2 when the AND circuit 11 outputs the H level signal, and does not drive the power MOSFET 2 when the AND circuit 11 outputs the L level signal. Specifically, when any one of the open detector 14, the current detector 15 and the temperature sensor 16 exhibits abnormality, the driver 12 makes control so as not to drive the power MOSFET 2.

Further, as shown in FIG. 2, the IPD 1 according to the exemplary embodiment includes an on-resistance detector 20, a gate leakage detector 30, an off-leakage detector 40, and a consumption current detector 50. The on-resistance detector 20 includes a circuit corresponding to the set value storage unit 3 and a circuit corresponding to the detector 4 shown in FIG. 1. The same applies to the gate leakage detector 30, the off-leakage detector 40 and the consumption current detector 50. Further, a power-on signal for notifying that power of the IPD 1 is turned on is supplied to the on-resistance detector 20, the gate leakage detector 30, the off-leakage detector 40, and the consumption current detector 50.

The on-resistance detector 20 is a circuit that detects the characteristic degradation of the IPD 1 based on the set value which is determined based on the initial characteristic value (the characteristic value at the time of manufacture) of the on-resistance of the power MOSFET 2 and the characteristic value of the on-resistance of the power MOSFET 2 at given timing. In this exemplary embodiment, it is assumed, for example, that the on-resistance detector 20 detects abnormality when the characteristic value of the on-resistance at given timing becomes equal to or larger than 1.1 times the set value determined based on the initial characteristic value of the on-resistance.

The gate leakage detector 30 detects the characteristic degradation of the IPD 1 in the off-state or the on-state based on the set value which is determined based on the initial characteristic value (the characteristic value at the time of manufacture) of the gate leakage of the power MOSFET 2 and the characteristic value of the gate leakage of the power MOSFET 2 at given timing. In this exemplary embodiment, it is assumed, for example, that the gate leakage detector 30 detects abnormality when the characteristic value of the gate leakage at given timing becomes equal to or larger than 1 µA, which is the set value determined based on the initial characteristic value (the characteristic value at the time of manufacture) of the gate leakage. Note that the set value determined based on the initial characteristic value is a set value (=0 µA+1 µA) that is obtained by adding an arbitrary value (e.g. 1 µA) to the initial characteristic value (e.g. 0 µA) of the gate leakage.

The off-leakage detector 40 is a circuit that detects the characteristic degradation of the IPD 1 based on the set value which is determined based on the initial characteristic value (the characteristic value at the time of manufacture) of the off-leakage of the power MOSFET 2 and the characteristic value of the off-leakage of the power MOSFET 2 at given timing. In this exemplary embodiment, it is assumed, for example, that the off-leakage detector 40 detects abnormality when the characteristic value of the off-leakage at given timing becomes equal to or larger than 1 µA, which is the set value determined based on the initial characteristic value (the characteristic value at the time of manufacture) of the off-leakage. Note that the set value determined based on the initial characteristic value is a set value (=0 µA+1 µA) that is obtained by adding an arbitrary value (e.g. 1 µA) to the initial characteristic value (e.g. 0 µA) of the off-leakage.

The consumption current detector 50 is a circuit that detects the characteristic degradation of the IPD 1 based on the set value which is determined based on the initial characteristic value (the characteristic value at the time of manufacture) of a consumption current Ic flowing through an internal GND line (internal reference line) 55 of the IPD 1 and the characteristic value of the consumption current of the IPD 1 at given timing. In this exemplary embodiment, it is assumed, for example, that the consumption current detector 50 detects abnormality when the characteristic value of the consumption current at given timing becomes equal to or larger than 1.1 times the set value determined based on the initial characteristic value of the consumption current.

An output 21 of the on-resistance detector 20, an output 31 of the gate leakage detector 30, an output 41 of the off-leakage detector 40, and an output 51 of the consumption current detector 50 are supplied to an NAND circuit 19. In this exemplary embodiment, it is assumed, for example, that it is nor- mal when the outputs 21, 31, 41, and 51 are H level and abnormal when they are L level. An output of the NAND circuit 19 is connected to the gate of an N-type MOS transistor MN2. When the NAND circuit 19 outputs an L level signal, an H level signal indicating normality is output from an output terminal (warning) 8. On the other hand, when the NAND circuit 19 outputs an H level signal, an L level signal indicating abnormality is output from the output terminal (warning) 8.

Specifically, when at least one of the following conditions (1) to (4) is satisfied, the L level signal indicating abnormality is output from the output terminal (warning) 8, and when none of the following conditions (1) to (4) is satisfied, the H level signal indicating normality is output from the output terminal (warning) 8.

(1) When the characteristic value of the on-resistance of the power MOSFET 2 at given timing becomes equal to or larger than 1.1 times the set value determined based on the initial characteristic value of the on-resistance of the power MOSFET 2. (2) When the characteristic value of the gate leakage of the power MOSFET 2 at given timing becomes equal to or larger than 1 µA, which is the set value.

(3) When the characteristic value of the off-leakage of the power MOSFET 2 at given timing becomes equal to or larger than 1 which is the set value.

(4) When the characteristic value of the consumption current of the IPD 1 at given timing becomes equal to or larger than 1.1 times the set value determined based on the initial characteristic value of the consumption current of the IPD 1.

The microcomputer 10 can determine the state of the degradation of the IPD 1 with time or the like based on the signal input from the output terminal (warning) 8. Further, when the signal indicating abnormality is input, the microcomputer 10 can display a message notifying the necessity of exchanging the IPD 1, change a control parameter of the IPD 1, or stop the operation of the IPD 1, for example.

Further, the characteristic values of the IPD 1 at given timing which are used when the on-resistance detector 20, the gate leakage detector 30, the off-leakage detector 40 and the consumption current detector 50 detect the characteristic degradation of the IPD 1 may be a characteristic value at power-on of the IPD 1, a characteristic value at timing when a control signal is supplied to the input terminal 7 of the IPD 1, a characteristic value at timing when an instruction signal for detecting the characteristic degradation of the IPD 1 is supplied from the controller to the IPD 1, a characteristic value at regular time intervals during the operation of the IPD 1 or the like, for example. Note that, besides those, the given timing to acquire the characteristic value of the IPD 1 may be set arbitrarily.

Figure 3:
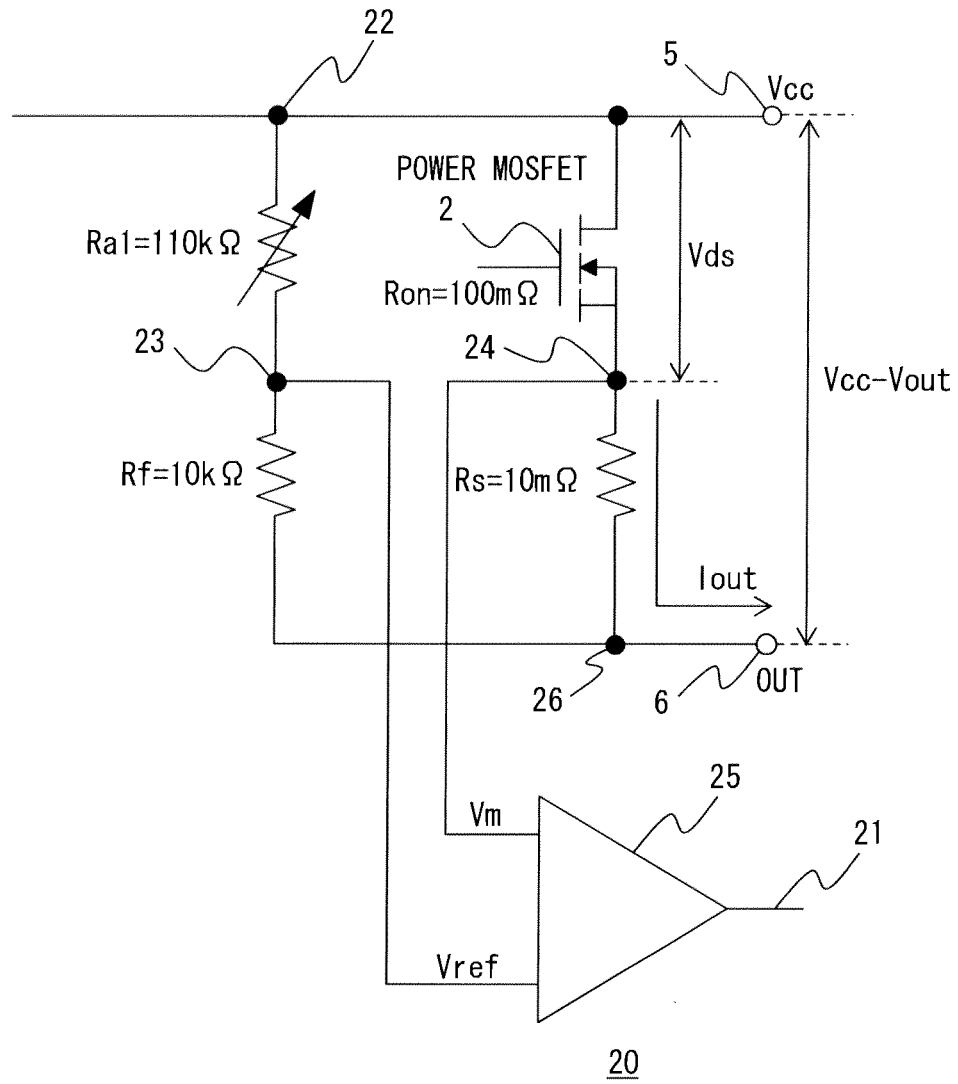
FIG. 3 is a circuit diagram showing an example of an on-resistance detector of the semiconductor apparatus (IPD) according to the first exemplary embodiment.

An example of a specific circuit configuration of the on-resistance detector 20 of the IPD 1 according to the exemplary embodiment is described hereinbelow. FIG. 3 is a circuit diagram showing an example of the on-resistance detector 20 of the IPD 1 according to the exemplary embodiment. The on-resistance detector 20 includes a resistor (first resistor) Rs, a resistor (second resistor) Rf, a variable resistor (first variable resistor) Ra1, and a comparator (first comparator) 25.

One end of the resistor Rs is connected to a node (first node) 24 on the source side of the power MOSFET 2, and the other end is connected to a node (second node) 26. One end of the variable resistor Ra1 is connected to a node 22 on the drain side of the power MOSFET 2, and the other end is connected to a node (third node) 23. One end of the resistor Rf is connected to the node 23, and the other end is connected to the node 26. Further, inputs of the comparator 25 are connected to the node 23 and the node 24, and an output 21 of the comparator 25 is connected to the input of the NAND circuit 19 in FIG. 2.

In the on-resistance detector 20 shown in FIG. 3, when the power MOSFET 2 is turned on, a current Tout flows from the source of the power MOSFET 2. At this time, the following relationship is established when a voltage Vcc-Vout between the power supply terminal (Vcc) 5 and the node 26 (the output terminal (OUT) 6) and a drain-source voltage Vds of the power MOSFET 2 are measured.

$$Vds/(Vcc-Vout)=Ron\times Iout/(Ron\times Iout+Rs\times Iout)=Ron/(Ron+Rs) \qquad \text{Expression 1:}$$

In the above Expression 1, Ron is the set value which is determined based on the initial characteristic value of the on-resistance of the power MOSFET 2. Thus, Ra1 with which the on-resistance of the power MOSFET 2 becomes equal to or larger than 1.1 times the set value determined based on the initial characteristic value of the on-resistance can be obtained by using the following relational expression.

$$Ron\times 1.1/(Ron\times 1.1+Rs)=Ra1/(Ra1+Rf) \qquad \text{Expression 2:}$$

For example, when the set value of the on-resistance is Ron=100 mΩ, Rs=10 mΩ and Rf=10 kΩ, Ra1=110 kΩ is obtained by using the above Expression 2. Thus, the obtained resistance value is used as the set value of the on-resistance detector 20.

At this time, at the node 23 of the on-resistance detector 20 shown in FIG. 3, Vref, which is a voltage value obtained by dividing the voltage Vcc−Vout between the power supply terminal (Vcc) 5 and the output terminal (OUT) 6 based on the resistance values of the resistor Ra1 and the resistor Rf appears (Vref is invariable because it is a set value). Further, at the node 24 of the on-resistance detector 20, Vm, which is a voltage value obtained by dividing the voltage Vcc−Vout between the power supply terminal (Vcc) 5 and the output terminal (OUT) 6 based on the on-resistance Ron of the power MOSFET 2 and the resistance Rs appears.

Because Ra1=110 kΩ, Rf=10 kΩ, Ron=100 mΩ, and Rs=10 mΩ in the initial state, the voltage Vref of the node 23 is lower than the voltage Vm of the node 24. The comparator 25 compares the voltage Vref of the node 23 and the voltage Vm of the node 24, and outputs a signal indicating normality (H level) when Vref<Vm.

On the other hand, as the value of the on-resistance Ron increases due to the characteristic degradation of the power MOSFET 2, the voltage Vm of the node 24 gradually decreases. Thus, the comparator 25 compares the voltage Vref of the node 23 and the voltage Vm of the node 24, and outputs a signal indicating abnormality (L level) when Vref≥Vm. Specifically, when the on-resistance of the power MOSFET 2 becomes equal to or higher than Ron×1.1 (i.e. 110 mΩ), the voltage Vref of the node 23 and the voltage Vm of the node 24 satisfy Vref≥Vm, and by comparing the magnitude relation using the comparator 25, abnormality of the on-resistance of the power MOSFET 2 can be detected.

Note that the on-resistance detector shown in FIG. 3 is one example, and any circuit may be used as long as the on-resistance of the power MOSFET 2 can be detected.

Figure 7:
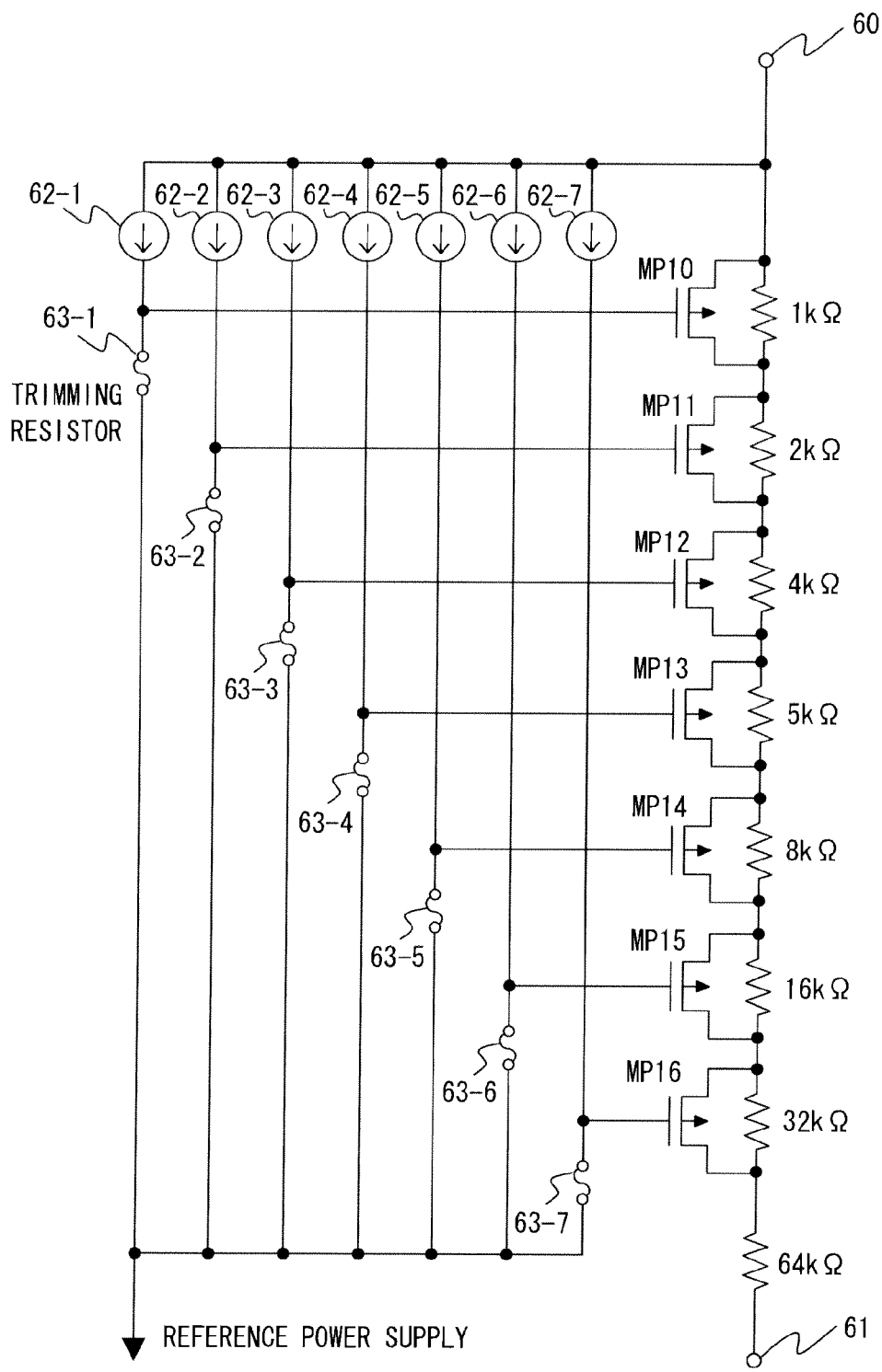
FIG. 7 is a circuit diagram showing an example of a set value storage unit of the semiconductor apparatus (IPD) according to the first exemplary embodiment.

Further, when the value of Ra1 is used as the set value of the on-resistance detector 20, a circuit (set value storage unit) shown in FIG. 7 may be used, for example. The circuit shown in FIG. 7 includes a plurality of resistors that are connected in series between a node 60 and a node 61. The resistance values of the resistors shown in FIG. 7 are just examples, and they may be varied arbitrarily. Further, the node 60 corresponds to the node 22 of the on-resistance detector 20 in FIG. 3, and the node 61 corresponds to the node 23 of the on-resistance detector 20 in FIG. 3. The source and the drain of each of P-type MOS transistors MP10 to MP16 are respectively connected to the both ends of each of the plurality of resistors connected in series. Further, constant current sources 62-1 to 62-7 are connected to the gates of the P-type MOS transistors MP10 to MP16, respectively. Between the constant current sources 62-1 to 62-7 and a reference power supply, trimming resistors 63-1 to 63-7 are placed at the positions corresponding to the P-type MOS transistors MP10 to MP16, respectively. The reference power supply may have a potential which can turn on the P-type MOS transistors MP10 to MP16, and it is connected to the internal GND line (internal reference line) of the IPD 1, for example.

When Ra1=110 kΩ as described in the exemplary embodiment, the resistors of 64 kΩ+32 kΩ+8 kΩ+4 kΩ+2 kΩ are selected, for example (in the case of FIG. 7, 64 kΩ is definitely selected). Specifically, the trimming resistors 63-2, 63-3, 63-5 and 63-7 are cut off by laser application, and the P-type MOS transistors MP11, MP12, MP14 and MP16 are turned off. Accordingly, the resistors of 2 kΩ, 4 kΩ, 8 kΩ and 32 kΩ are selected, so that the resistance value between the node 60 and the node 61 is 110 kΩ.

In the circuit shown in FIG. 7, Ra1 can be set in units of 1 kΩ from 64 kΩ to 132 kΩ. Thus, even when the on-resistance Ron of the power MOSFET 2 varies from 80 kΩ to 120 kΩ, it is possible to set a detecting point which is 1.1 times the on-resistance Ron. Specifically, Ra1 can be set in the range of 88 kΩ to 132 kΩ Note that a circuit of setting Ra1 shown in FIG. 7 is one example, and any circuit may be used as long as Ra1 can be set.

Figure 4:
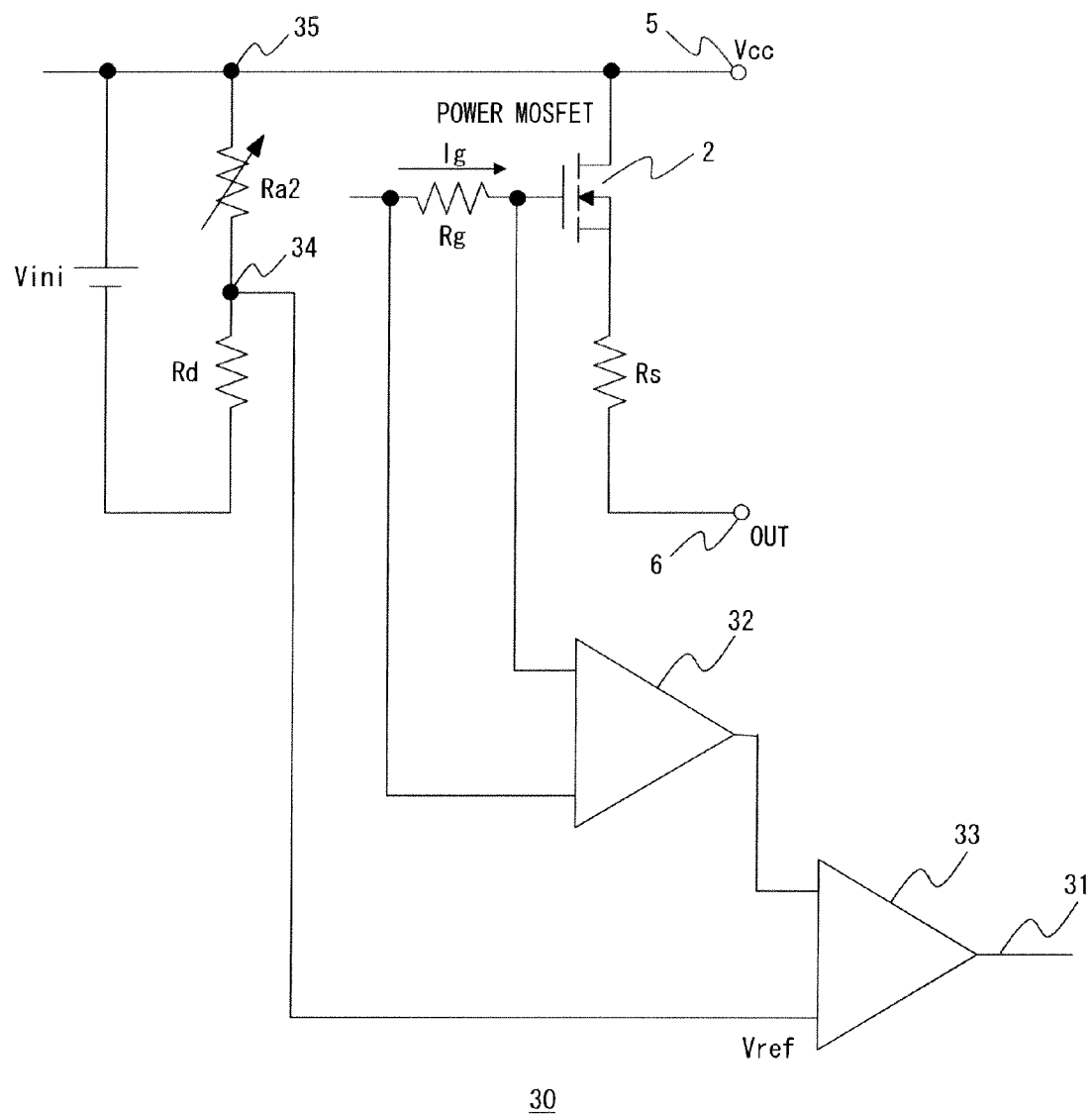
FIG. 4 is a circuit diagram showing an example of a gate leakage detector of the semiconductor apparatus (IPD) according to the first exemplary embodiment.

An example of a specific circuit configuration of the gate leakage detector 30 of the IPD 1 according to the exemplary embodiment is described hereinbelow. FIG. 4 is a circuit diagram showing an example of the gate leakage detector 30 of the IPD 1 according to the exemplary embodiment. The gate leakage detector 30 includes a resistor (third resistor) Rg, a variable resistor (second variable resistor) Ra2, a resistor (fifth resistor) Rd, a constant voltage source (first constant voltage source) Vini, an operational amplifier (first operational amplifier) 32, and a comparator (second comparator) 33.

The resistor Rg is connected to the gate of the power MOSFET 2, and one end is connected to one input of the operational amplifier 32, and the other end is connected to the other input of the operational amplifier 32. One end of the variable resistor Ra2 is connected to a node 35 on the drain side of the power MOSFET 2, and the other end is connected to a node 34. One end of the resistor Rd is connected to the node 34, and the other end is connected to one end of the constant voltage source Vini. Further, the other end of the constant voltage source Vini is connected to the node 35. The inputs of the operational amplifier 32 are connected to the both ends of the resistor Rg, and the output is connected to one input of the comparator 33. The other input of the comparator 33 is connected to the node 34, and an output 31 of the comparator 33 is connected to the input of the NAND circuit 19 in FIG. 2.

A voltage which is determined based on the voltage value of the constant voltage source Vini, the resistance value of the variable resistor Ra2 and the resistance value of the resistor Rd appears at the node 34. The voltage value of the node 34 is supplied to the comparator 33 as a reference voltage Vref. The reference voltage Vref can be varied arbitrarily by changing the value of the variable resistor Ra2.

Further, when there is no gate leakage in the power MOSFET 2, a gate leakage current Ig does not flow through the resistor Rg. In this case, no potential difference exists between the both ends of the resistor Rg, which are the inputs of the operational amplifier 32. However, when there is a gate leakage in the power MOSFET 2, the gate leakage current Ig flows through the resistor Rg, and a potential difference exists between the both ends of the resistor Rg, which are the inputs of the operational amplifier 32. The operational amplifier 32 outputs a signal based on the potential difference between the both ends of the resistor Rg. Accordingly, as the gate leakage current Ig increases, the potential difference between the both ends of the resistor Rg increases. The output voltage of the operational amplifier 32 is supplied to one input of the comparator 33 and compared with the reference voltage Vref which is set by the variable resistor Ra2. The comparator 33 outputs an H level signal indicating normality when the output voltage of the operational amplifier 32 is lower than the reference voltage Vref, and outputs an L level signal indicating abnormality when the output voltage of the operational amplifier 32 is equal to or higher than the reference voltage Vref.

For example, when detecting a case where the gate leakage current Ig becomes equal to or larger than 1 µA by using the gate leakage detector 30, the resistance value of the variable resistor Ra2 is set as follows. First, a potential difference which exists between the both ends of the resistor Rg when the gate leakage current Ig of 1 µA flows therethrough is obtained. Next, the voltage value which is output from the operational amplifier 32 when the potential difference is supplied to the operational amplifier 32 is obtained. Then, the resistance value of the variable resistor Ra2 is determined in such a way that the voltage value and the reference voltage Vref are equal. By setting the resistance value of the variable resistor Ra2 in this manner, it can be set so that the comparator 33 outputs an H level signal indicating normality when the gate leakage current Ig is smaller than 1 µA, and outputs an L level signal indicating abnormality when the gate leakage current Ig is equal to or larger than 1 µA.

Note that, in the gate leakage detector 30 also, the circuit shown in FIG. 7 may be used for setting of the variable resistor Ra2. Further, the gate leakage detector shown in FIG. 4 is one example, and any circuit may be used as long as the gate leakage of the power MOSFET 2 can be detected.

Figure 5:
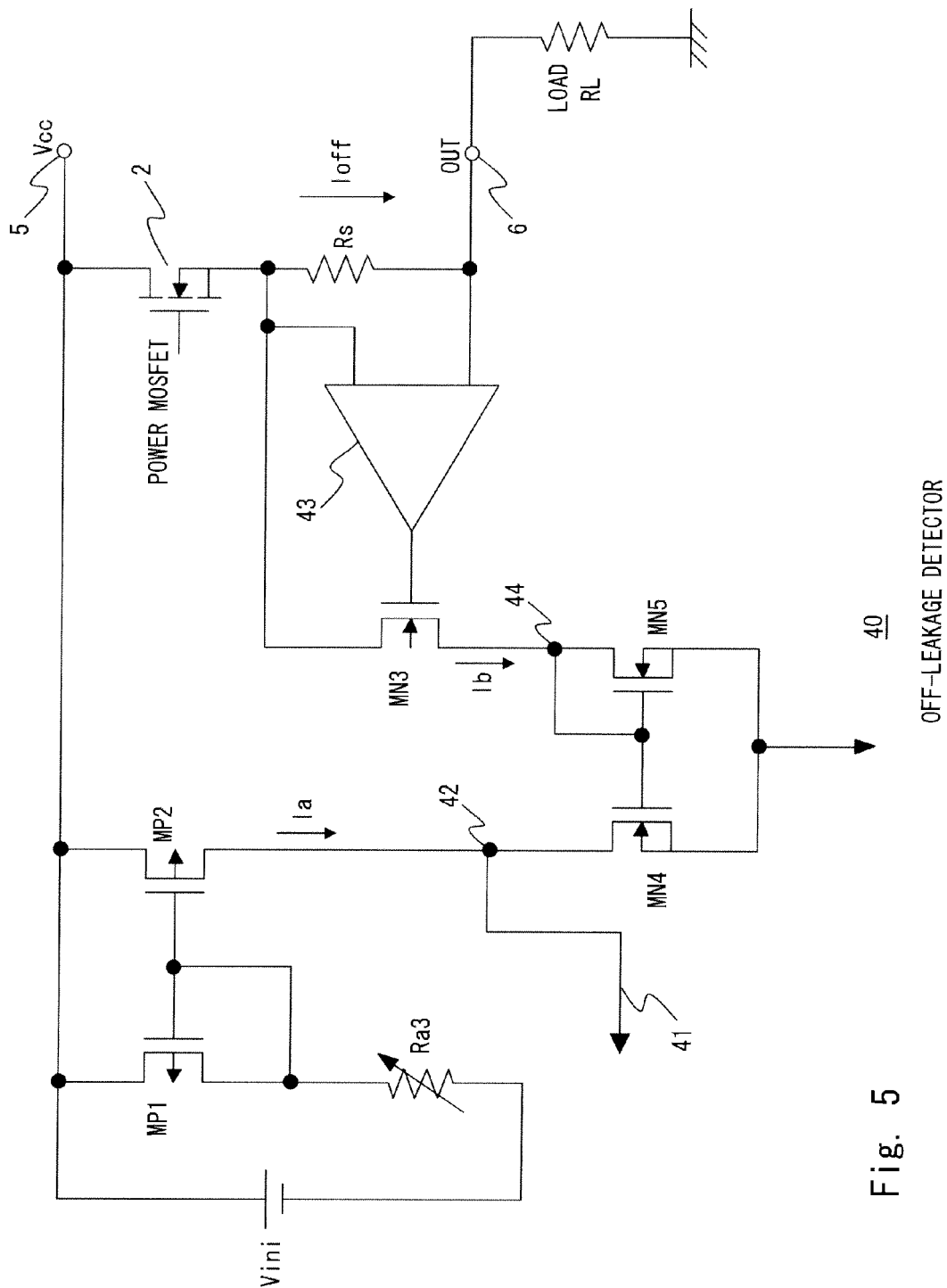
FIG. 5 is a circuit diagram showing an example of an off-leakage detector of the semiconductor apparatus (IPD) according to the first exemplary embodiment.

An example of a specific circuit configuration of the off-leakage detector 40 of the IPD 1 according to the exemplary embodiment is described hereinbelow. FIG. 5 is a circuit diagram showing an example of the off-leakage detector 40 of the IPD 1 according to the exemplary embodiment. The off-leakage detector 40 includes a resistor (sixth resistor) Rs, a variable resistor (third variable resistor) Ra3, a constant voltage source (second constant voltage source) Vini, N-type MOS transistors MN3 to MN5, P-type MOS transistors MP1 and MP2, and an operational amplifier (third operational amplifier) 43.

The resistor Rs is connected to the source of the power MOSFET 2. Further, the both ends of the resistor Rs are connected to the inputs of the operational amplifier 43. The output of the operational amplifier 43 is connected to the gate of the N-type MOS transistor (first transistor) MN3. The drain of the N-type MOS transistor MN3 is connected to the source of the power MOSFET 2, and the source of the N-type MOS transistor MN3 is connected to a node (fourth node) 44. The node 44 is connected to the drain and the gate of the N-type MOS transistor MN5. The source of the N-type MOS transistor MN5 is connected to the source of the N-type MOS transistor MN4, and the gate of the N-type MOS transistor MN5 is connected to the gate of the N-type MOS transistor MN4. The drain of the N-type MOS transistor MN4 is connected to a node (fifth node) 42. The N-type MOS transistors MN4 and MN5 form a current mirror (first current mirror).

Further, the source of the P-type MOS transistor MP1 is connected to the source of the P-type MOS transistor MP2, the power supply terminal (Vcc) 5, and one end of the constant voltage source (second constant voltage source) Vini. Further, the gate and the drain of the P-type MOS transistor MP1 are connected to the gate of the P-type MOS transistor MP2 and one end of the variable resistor (third variable resistor) Ra3. The other end of the variable resistor Ra3 is connected to the other end of the constant voltage source Vini. Further, the drain of the P-type MOS transistor MP2 is connected to the node 42. The P-type MOS transistors MP1 and MP2 form a current mirror (second current mirror). Further, an output 41 of the node 42 is connected to the input of the NAND circuit 19 in FIG. 2.

A current Ia which is determined based on the voltage value of the constant voltage source Vini and the resistance value of the variable resistor Ra3 flows to the node 42. Further, when an off-leakage current Ioff does not flow through the resistor Rs, a potential difference does not exist between the both ends of the resistor Rs, and the output of the operational amplifier 43 is an L level signal, and the N-type MOS transistor MN3 does not turn on. In this case, no current flows to the node 44, and therefore no current flows also to the N-type MOS transistor MN4. Therefore, a current flowing to the node 42 remains the current Ia. In this case, the node 42 is H level, and the off-leakage detector 40 outputs an H level signal indicating normality.

On the other hand, when an off-leakage current Ioff flows through the resistor Rs, a potential difference exists between the both ends of the resistor Rs. The potential difference is supplied to the input of the operational amplifier 43, and the operational amplifier 43 outputs a signal corresponding to the potential difference (H level signal) to the gate of the N-type MOS transistor MN3. When the H level signal is supplied to the gate of the N-type MOS transistor MN3, a current Ib flows to the node 44. The value of the current Ib varies depending on the level of the off-leakage current Ioff. When the current Ib flows to the node 44, the current Ib flows also to the N-type MOS transistor MN4. Therefore, a current flowing to the node 42 is Ia-Ib. Thus, as the level of the off-leakage current Ioff increases, Ib increases, and the current Ia-Ib flowing to the node 42 gradually decreases. In the end, the node 42 becomes L level, and the off-leakage detector 40 outputs an L level signal indicating abnormality.

For example, when detecting a case where the off-leakage current Ioff becomes equal to or larger than 1 µA by using the off-leakage detector 40, the resistance value of the variable resistor Ra3 is set as follows. First, a potential difference which exists between the both ends of the resistor Rg when the off-leakage current Ioff of 1 µA flows therethrough is obtained. Next, the voltage value which is output from the operational amplifier 43 when the potential difference is supplied to the operational amplifier 43 is obtained. Further, the current Ib which flows to the node 44 when the voltage value is applied to the gate of the N-type MOS transistor MN3 is obtained. Then, the value of the current Ia with which the L level signal is output from the output 41 when the current Ib flows to the N-type MOS transistor MN4 is determined. After that, the resistance value of the variable resistor Ra3 is determined so that the current Ia flows to the node 42 in the state where the current Ib does not flow to the N-type MOS transistor MN4 is determined. By setting the resistance value of the variable resistor Ra3 in this manner, it can be set so that an H level signal indicating normality is output from the output 41 when the off-leakage current Ioff is smaller than 1 µA, and an L level signal indicating abnormality is output from the output 41 when the off-leakage current Ioff is equal to or larger than 1 µA.

Note that, in the off-leakage detector 40 also, the circuit shown in FIG. 7 may be used for setting of the variable resistor Ra3. Further, the off-leakage detector shown in FIG. 5 is one example, and any circuit may be used as long as the off-leakage of the power MOSFET 2 can be detected.

Figure 6:
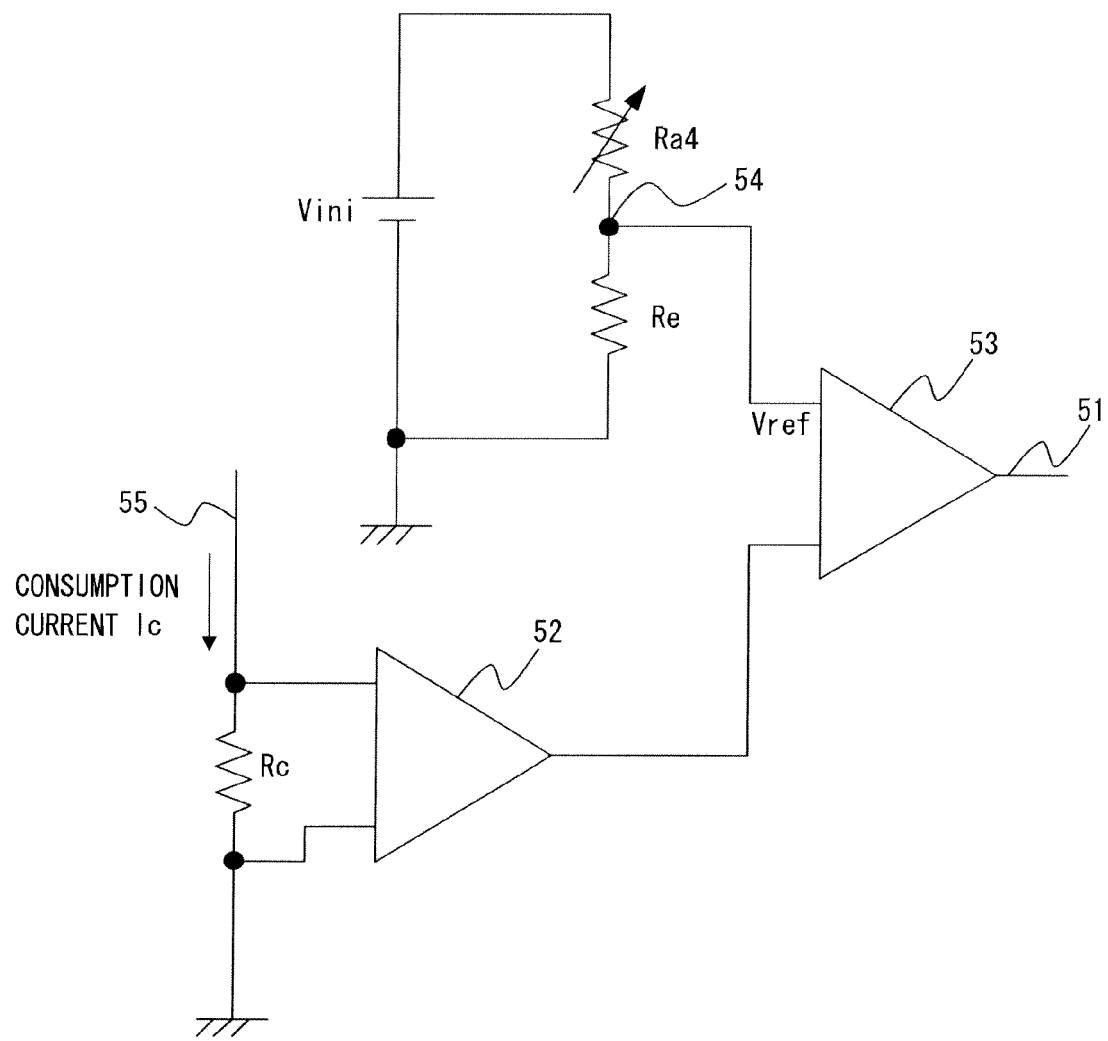
FIG. 6 is a circuit diagram showing an example of a consumption current detector of the semiconductor apparatus (IPD) according to the first exemplary embodiment.

An example of a specific circuit configuration of the consumption current detector 50 of the IPD 1 according to the exemplary embodiment is described hereinbelow. FIG. 6 is a circuit diagram showing an example of the consumption current detector 50 of the IPD 1 according to the exemplary embodiment. The consumption current detector 50 includes a resistor (fourth resistor) Re, a variable resistor (second variable resistor) Ra4, a resistor (fifth resistor) Re, a constant voltage source (first constant voltage source) Vini, an operational amplifier (second operational amplifier) 52, and a comparator (third comparator) 53.

The resistor Rc is connected between the internal GND line (internal reference line) 55 of the IPD 1, which is the line at the L level of the open detector 14, the current detector 15, the temperature sensor 16, the on-resistance detector 20, the gate leakage detector 30, the off-leakage detector 40, the AND circuit 17, the inverter 18, the N-type MOS transistor MN1, the NAND circuit 19 and the N-type MOS transistor MN2 and the GND terminal of the IPD 1. One end of the resistor Rc is connected to one input of the operational amplifier 52, and the other end of the resistor Re is connected to the other input of the operational amplifier 52. The output of the operational amplifier 52 is connected to one input of the comparator 53. The other input of the comparator 53 is connected to a node 54, and the output 51 is connected to the input of the NAND circuit 19 in FIG. 2. One end of the variable resistor Ra4 is connected to the node 54, and the other end of the variable resistor Ra4 is connected to one end of the constant voltage source Vini. One end of the resistor Re is connected to the node 54, and the other end of the resistor Re is connected to the other end of the constant voltage source Vini and the GND terminal.

A voltage which is determined based on the voltage value of the constant voltage source Vini, the resistance value of the variable resistor Ra4 and the resistance value of the resistor Re appears at the node 54. The voltage value of the node 54 is supplied to the comparator 53 as a reference voltage Vref. The reference voltage Vref can be varied arbitrarily by changing the value of the variable resistor Ra4.

During normal operation, a consumption current Ic at a normal level flows through the resistor Re, and a potential difference corresponding to the level exists at the both ends of the resistor Re. The potential difference at the both ends of the resistor Rc is supplied to the operational amplifier 52, and the operational amplifier 52 outputs an output voltage corresponding to the potential difference to one input of the comparator 53. The output voltage which is supplied to the comparator 53 is compared with the reference voltage Vref which is set by the variable resistor Ra4. Because the output voltage of the operational amplifier 52 is lower than the reference voltage Vref during normal operation, the comparator 53 outputs an H level signal indicating normality. However, when the consumption current Ic flowing through the resistor Rc increases due to the characteristic degradation of the power MOSFET 2, the potential difference at the both ends of the resistor Rc increases, and the output voltage of the operational amplifier 52 becomes higher. Then, when the output voltage of the operational amplifier 52 is equal to or higher than the reference voltage Vref, the comparator 53 outputs an L level signal indicating abnormality.

For example, when detecting a case where the consumption current Ic becomes equal to or larger than 1.1 times the set value determined based on the initial characteristic value by using the consumption current detector 50, the resistance value of the variable resistor Ra4 is set as follows. First, a potential difference which exists between the both ends of the resistor Rc when the consumption current Ic which is 1.1 times the set value determined based on the initial characteristic value flows therethrough is obtained. Next, the voltage value which is output from the operational amplifier 52 when the potential difference is supplied to the operational amplifier 52 is obtained. Then, the resistance value of the variable resistor Ra4 is determined in such a way that the voltage value and the reference voltage Vref are equal. By setting the resistance value of the variable resistor Ra4 in this manner, it can be set so that the comparator 53 outputs an H level signal indicating normality when the consumption current Ic is smaller than 1.1 times the set value determined based on the initial characteristic value, and the comparator 53 outputs an L level signal indicating abnormality when the consumption current Ic is equal to or larger than 1.1 times the set value determined based on the initial characteristic value.

Note that, in the consumption current detector 50 also, the circuit shown in FIG. 7 may be used for setting of the variable resistor Ra4. Further, the consumption current detector shown in FIG. 6 is one example, and any circuit may be used as long as the consumption current can be detected.

Figure 8:
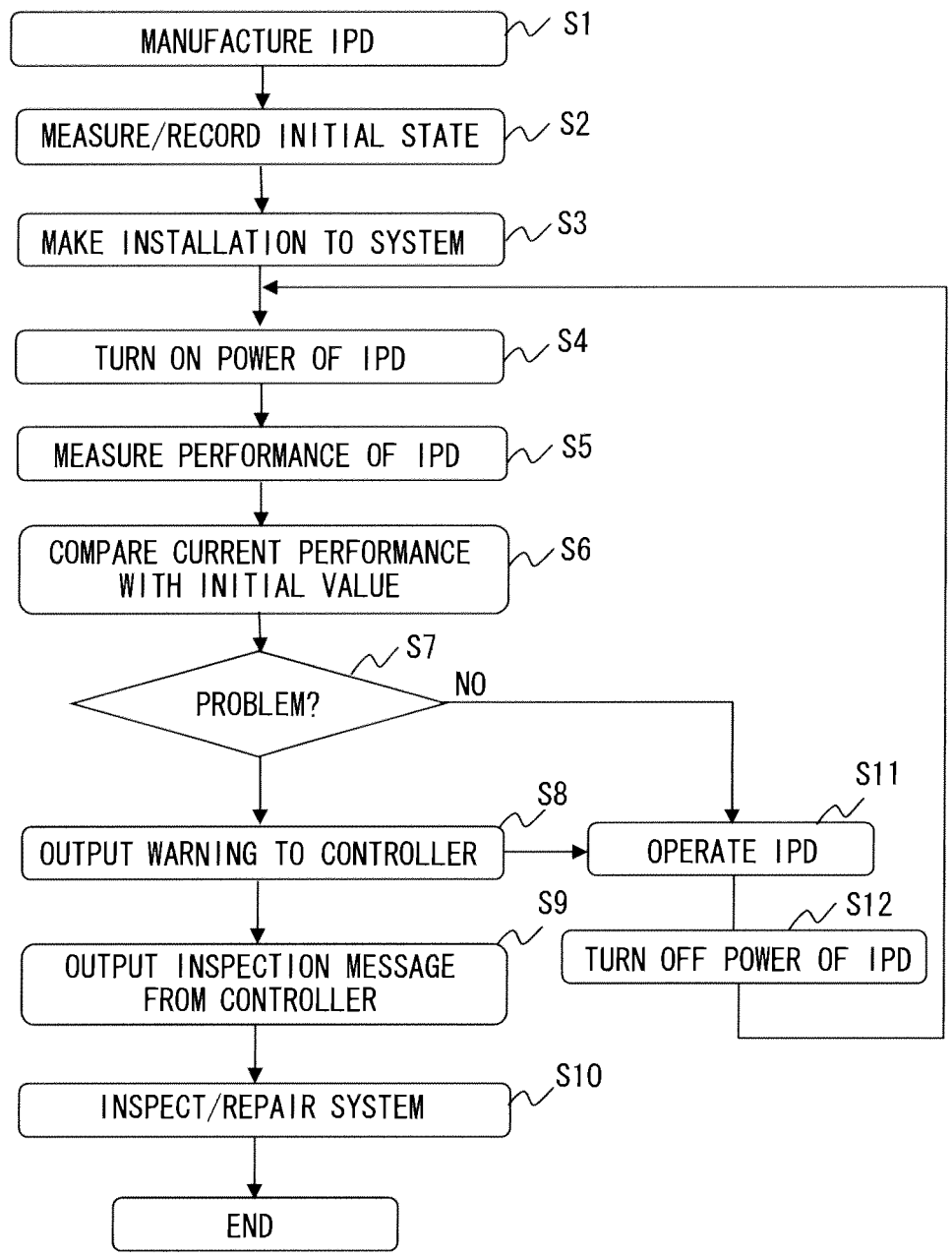
FIG. 8 is a flowchart to describe a flow from manufacture to abnormality detection of the semiconductor apparatus (IPD) according to the first exemplary embodiment.

A flow from manufacture to abnormality detection of the semiconductor apparatus according to the exemplary embodiment is described hereinafter with reference to FIG. 8. First, the intelligent power device (IPD 1) which is the semiconductor apparatus according to the exemplary embodiment is manufactured (Step S1). Next, the initial characteristics of the power MOSFET are measured, and the set value determined based on the initial characteristic value is recorded (Step S2). Specifically, the initial characteristic value (e.g. the on-resistance Ron) is measured in the state of the semiconductor chip (or wafer), trimming resistors are cut off by laser or the like based thereon so that the resistance becomes the set value (e.g. the variable resistance Ra1), and then assembly of the semiconductor chip to a lead frame, resin molding and cutout from the lead frame are performed, thereby completing each IPD 1. When recording the set value, the values of the resistance values Ra1 to Ra4 described above are used as the set value, for example. Then, the IPD 1 is installed into a system such as an engine control unit (ECU) (Step S3). After that, the power of the IPD 1 is turned on (Step S4). When the IPD 1 is powered on, the performance of the IPD 1 is measured (Step S5). Specifically, in the IPD 1, the on-resistance detector 20, the gate leakage detector 30, the off-leakage detector 40, and the consumption current detector 50 measure the characteristic values of the IPD 1.

Then, the respective characteristic values of the IPD 1 measured in Step S5 are compared with the initial value (the set value determined based on the initial characteristic value) (Step S6). It is then determined whether there is a problem in the characteristic values measured in Step S5 (Step S7). When there is a problem in the characteristic values measured in Step S5, a warning is output to the controller (microcomputer) of the IPD 1 (Step S8). After that, a message notifying the necessity of an inspection of the semiconductor apparatus is output from the controller (Step S9). Specifically, a message that recommends an inspection to a user such as a driver or an automobile dealer is output from the microcomputer, which is the controller. By the message, an inspection of a system (automobile) is encouraged, and adjustment or repairer is performed in an automobile repair shop or the like (Step S10). This avoids a breakdown of the IPD 1 and enables the safe operation of the system.

On the other hand, when there is no problem in the characteristic values measured in Step S5, and after the warning is output to the microcomputer in Step S8, the IPD 1 is made to operate (Step S11). After that, when a control signal for turning off the IPD 1 is supplied from the input terminal 7, the power of the IPD 1 is turned off (Step S12), the process proceeds to Step S4 and then repeats the operation from Step S4.

As described above, in the IPD 1 according to the exemplary embodiment, the characteristic degradation which leads to a failure of the IPD 1 can be detected based on the set value determined based on the initial characteristic value of the IPD 1 and the characteristic value of the IPD 1 at given timing, and it is thereby possible to prevent a failure of the IPD 1 from occurring.

Further, in the IPD 1 according to the exemplary embodiment, when there is a sign of a failure of the IPD 1, a warning can be issued to a user such as a driver by the microcomputer, and it is thereby possible to avoid the malfunction of a system (automobile etc.), and, consequently, it is possible to significantly improve the safety of the system.

Note that Japanese Unexamined Patent Application Publication No. 2007-174756 discloses the technique that detects an on-failure caused by a dielectric breakdown in advance by placing a gate resistor at the gate of the power MOSFET and measuring a voltage drop of the gate resistor when the power MOSFET is on. Further, Japanese Utility Model No. 2599788 discloses the technique related to a failure detector that can perform failure identification even when a power MOSFET is in a semi-failure state. However, the techniques according to Japanese Unexamined Patent Application Publication No. 2007-174756 and Japanese Utility Model No. 2599788 disclose nothing about storing the set value determined based on the initial characteristic value (the characteristic value at the time of manufacture) of the IPD and detecting the characteristic degradation which leads to a failure of the IPD based on the set value and the characteristic value of the IPD at given timing as described in the exemplary embodiment of the present invention. On the other hand, according to the exemplary embodiment of the present invention, the initial characteristic value of the IPD is measured before resin molding of a semiconductor chip, the set value is written to the semiconductor chip by cutting off trimming resistors, and then resin molding is made to thereby complete the IPD. A user of the IPD can thereby know the degradation state of the IPD without re-measuring the initial characteristic value, determining the set value for detecting the characteristic degradation state or adding a characteristic degradation detector.

Second Exemplary Embodiment

Figure 9:
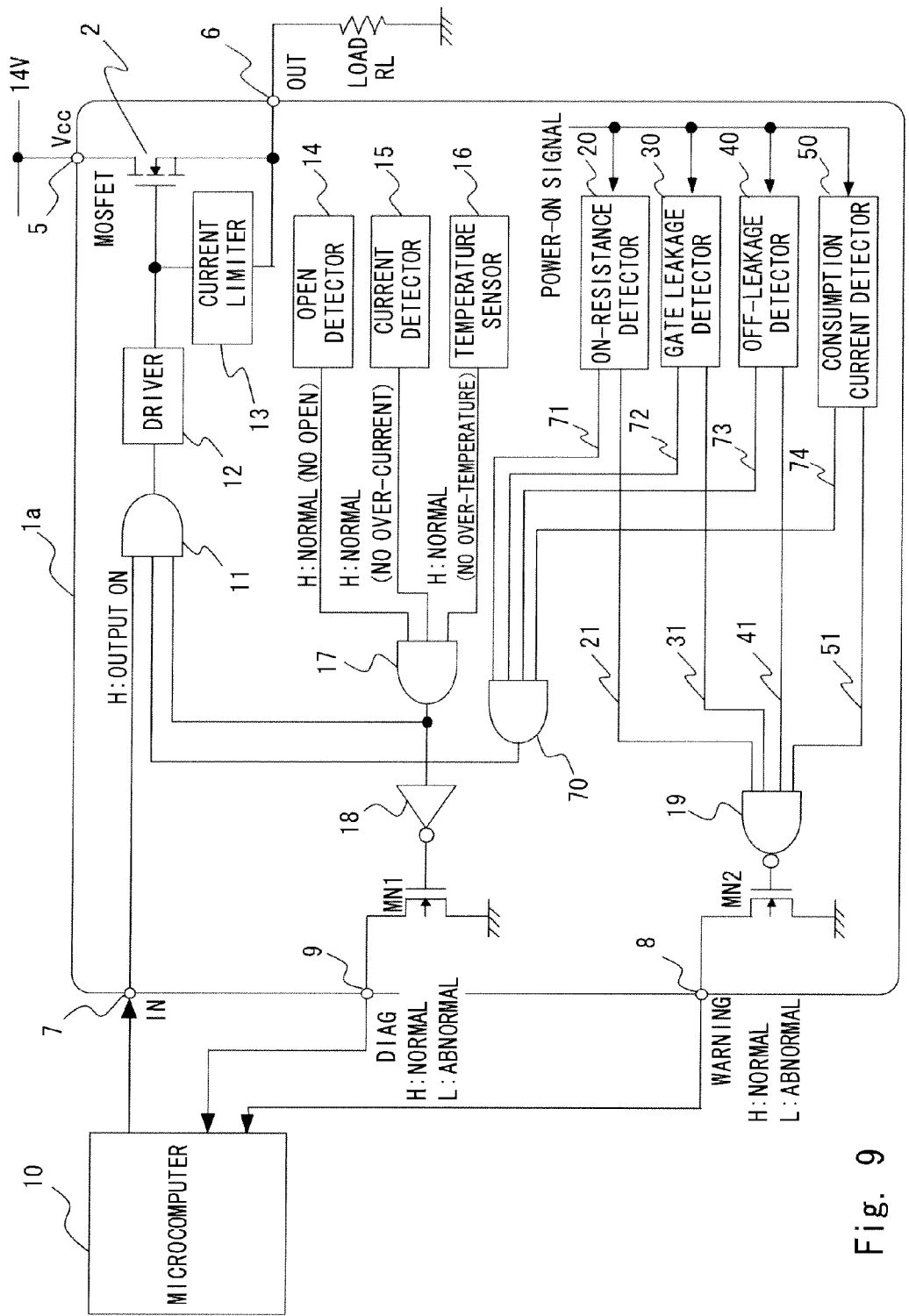
FIG. 9 is a block diagram showing a semiconductor apparatus (IPD) according to a second exemplary embodiment.

A second exemplary embodiment of the present invention is described hereinafter with reference to the drawings. FIG. 9 is a block diagram showing an IPD (semiconductor apparatus) according to the exemplary embodiment. In the IPD 1$a$ according to the exemplary embodiment, the outputs of the on-resistance detector 20, the gate leakage detector 30, the off-leakage detector 40, and the consumption current detector 50 are output also to an AND circuit 70, and the output of the AND circuit 70 is supplied to the AND circuit 11. The other part is the same as that of the IPD 1 described in the first exemplary embodiment, and redundant explanation thereof is omitted. Note that the same elements as in the IPD 1 described in the first exemplary embodiment are denoted by the reference symbols. Further, although connections between the line at the L level of the respective elements that constitute the IPD 1$a$ and the consumption current detector 50 are not illustrated in FIG. 9 to avoid complication of the figure, the consumption current detector 50 is connected with the line at the L level of the respective elements that constitute the IPD 1$a$, which is the internal GND line (internal reference line), and the GND terminal of the IPD 1$a$ in FIG. 9 also, just like the case of FIG. 2.

In the IPD 1$a$ according to the exemplary embodiment, a set value (first set value) which is determined based on the initial characteristic value that is set in the first exemplary embodiment and a set value (second set value) which is determined to be a different value from the first set value are stored in the on-resistance detector 20, the gate leakage detector 30, the off-leakage detector 40, and the consumption current detector 50. Then, a comparison result between the first set value set in this exemplary embodiment and the characteristic value of the IPD 1$a$ at given timing is output to the AND circuit 19. Further, the same comparison is made for the second set value, and a comparison result is output to the AND circuit 70.

When the characteristic value of the on-resistance of the power MOSFET 2 at given timing becomes equal to or larger than 1.1 times (the first set value) the set value determined based on the initial characteristic value of the on-resistance, for example, the on-resistance detector 20 detects abnormality at the level corresponding to the first set value and outputs a signal 21 indicating abnormality to the AND circuit 19. Further, when the characteristic value of the on-resistance at given timing becomes equal to or larger than 1.5 times (the second set value) the set value determined based on the initial characteristic value of the on-resistance, for example, the on-resistance detector 20 detects abnormality at the level corresponding to the second set value and outputs a signal 71 indicating abnormality to the AND circuit 70.

When the characteristic value of the gate leakage of the power MOSFET 2 at given timing becomes equal to or larger than 1 µA (the first set value), which is the set value determined based on the initial characteristic value of the gate leakage, for example, the gate leakage detector 30 detects abnormality at the level corresponding to the first set value and outputs a signal 31 indicating abnormality to the AND circuit 19. Further, when the characteristic value of the gate leakage at given timing becomes equal to or larger than 10 µA (the second set value), which is the set value determined based on the initial characteristic value of the gate leakage, for example, the gate leakage detector 30 detects abnormality at the level corresponding to the second set value and outputs a signal 72 indicating abnormality to the AND circuit 70.

When the characteristic value of the off-leakage of the power MOSFET 2 at given timing becomes equal to or larger than 1 µA (the first set value), which is the set value determined based on the initial characteristic value of the off-leakage, for example, the off-leakage detector 40 detects abnormality at the level corresponding to the first set value and outputs a signal 41 indicating abnormality to the AND circuit 19. Further, when the characteristic value of the off-leakage at given timing becomes equal to or larger than 10 µA (the second set value), which is the set value determined based on the initial characteristic value of the off-leakage, for example, the off-leakage detector 40 detects abnormality at the level corresponding to the second set value and outputs a signal 73 indicating abnormality to the AND circuit 70.

When the characteristic value of the consumption current of the IPD 1 at given timing becomes equal to or larger than 1.1 times (the first set value) the set value determined based on the initial characteristic value of the consumption current, for example, the consumption current detector 50 detects abnormality at the level corresponding to the first set value and outputs a signal 51 indicating abnormality to the AND circuit 19. Further, when the characteristic value of the consumption current at given timing becomes equal to or larger than 1.5 times (the second set value) the set value determined based on the initial characteristic value of the consumption current, for example, the consumption current detector 50 detects abnormality at the level corresponding to the second set value and outputs a signal 74 indicating abnormality to the AND circuit 70.

Specifically, when at least one of the following conditions (1) to (4) for the first set value is satisfied, the L level signal indicating abnormality is output from the output terminal (warning) 8, and when none of the following conditions (1) to (4) for the first set value is satisfied, the H level signal indicating normality is output from the output terminal (warning) 8.

(1) When the characteristic value of the on-resistance of the power MOSFET 2 at given timing becomes equal to or larger than 1.1 times the set value determined based on the initial characteristic value of the on-resistance.

(2) When the characteristic value of the gate leakage of the power MOSFET 2 at given timing becomes equal to or larger than 1 μA, which is the set value.

(3) When the characteristic value of the off-leakage of the power MOSFET 2 at given timing becomes equal to or larger than 1 μA, which is the set value.

(4) When the characteristic value of the consumption current of the IPD 1a at given timing becomes equal to or larger than 1.1 times the set value determined based on the initial characteristic value of the consumption current.

Further, when at least one of the following conditions (5) to (8) for the second set value is satisfied, the AND circuit 70 outputs the L level signal to the AND circuit 11. Then, because the AND circuit 11 outputs the L level signal to the driver 12, the operation of the IPD 1a is stopped. On the other hand, when none of the following conditions (5) to (8) for the second set value is satisfied, the AND circuit 70 outputs the H level signal to the AND circuit 11. Then, because the AND circuit 11 outputs the H level signal to the driver 12, the operation of the IPD 1a is enabled.

(5) When the characteristic value of the on-resistance of the power MOSFET 2 at given timing becomes equal to or larger than 1.5 times the set value determined based on the initial characteristic value of the on-resistance.

(6) When the characteristic value of the gate leakage of the power MOSFET 2 at given timing becomes equal to or larger than 10 μA, which is the set value.

(7) When the characteristic value of the off-leakage of the power MOSFET 2 at given timing becomes equal to or larger than 10 μA, which is the set value.

(8) When the characteristic value of the consumption current of the IPD 1a at given timing becomes equal to or larger than 1.5 times the set value determined based on the initial characteristic value of the consumption current.

Note that, when the on-resistance detector 20, the gate leakage detector 30, the off-leakage detector 40 and the consumption current detector 50 detect the first set value and the second set value, two each of the detectors shown in FIGS. 3 to 6 described in the first exemplary embodiment are used, and the circuit (set value storage unit) shown in FIG. 7 is used for each of them.

Figure 10:
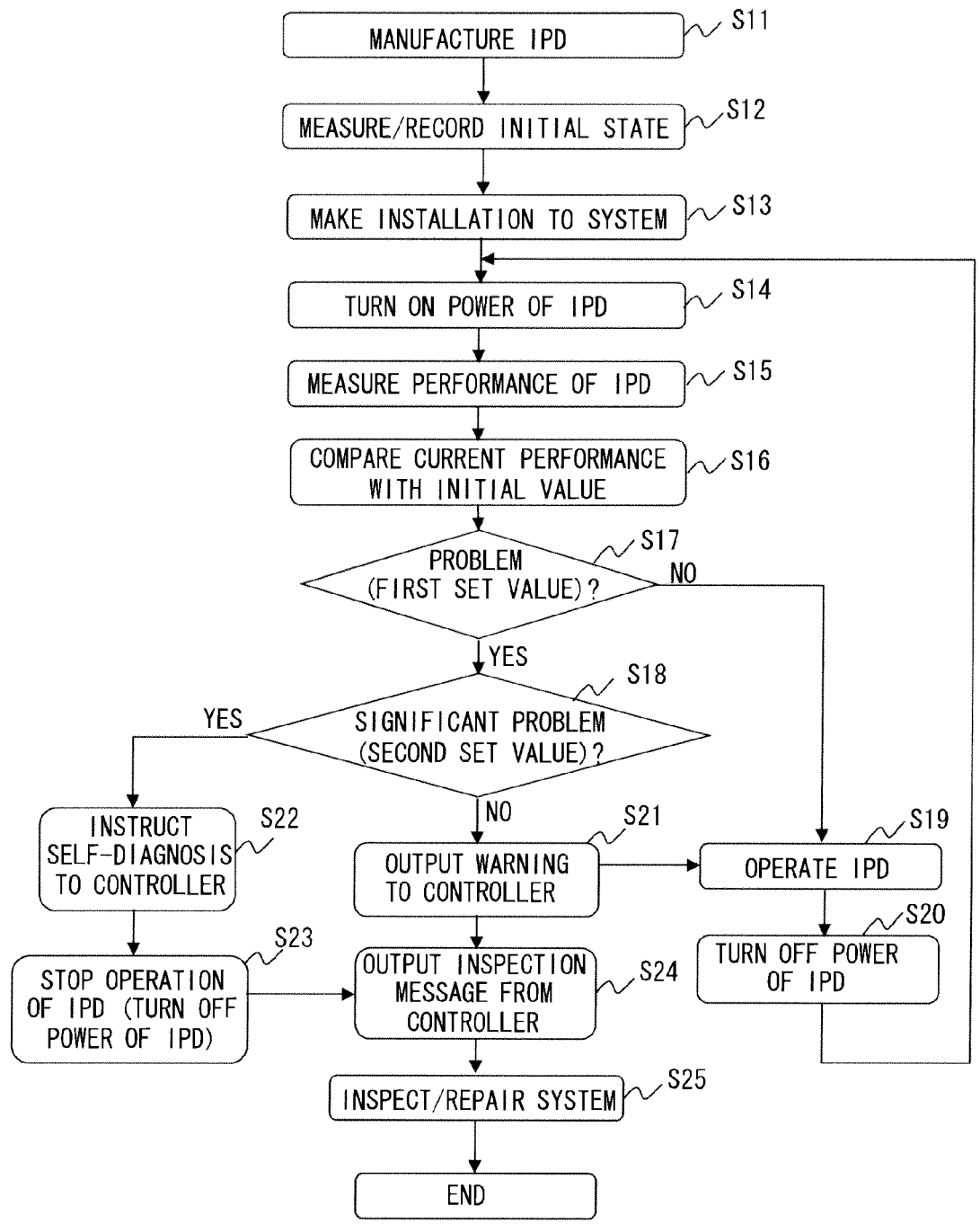
FIG. 10 is a flowchart to describe a flow from manufacture to abnormality detection of the semiconductor apparatus (IPD) according to the second exemplary embodiment.
Figure 11:
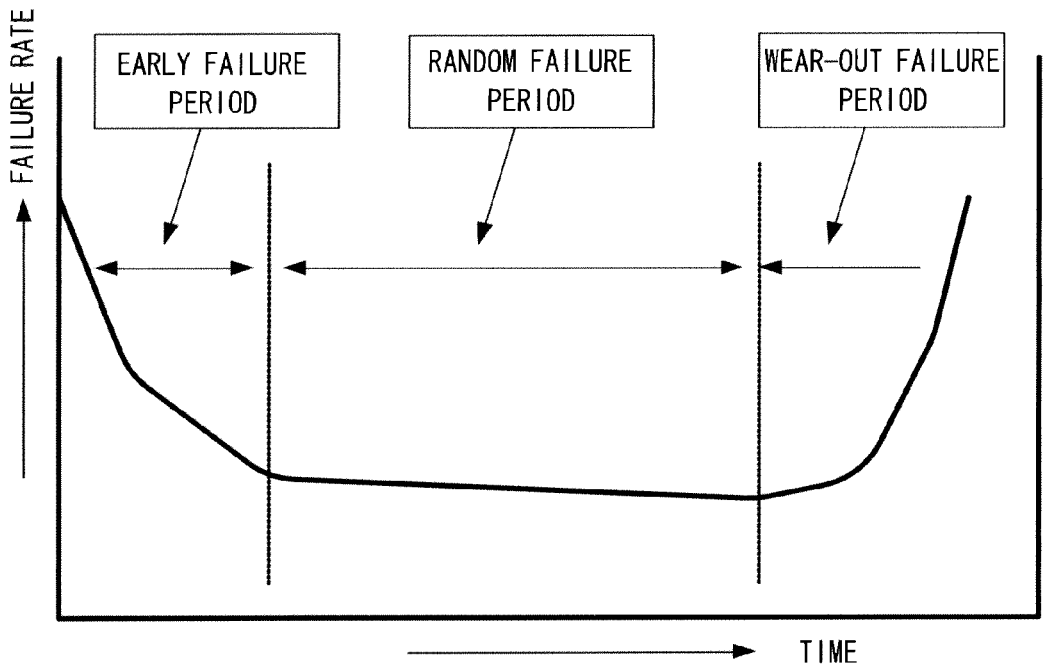
FIG. 11 is a view showing a change in a failure rate of an IPD with the lapse of time.
Figure 12:
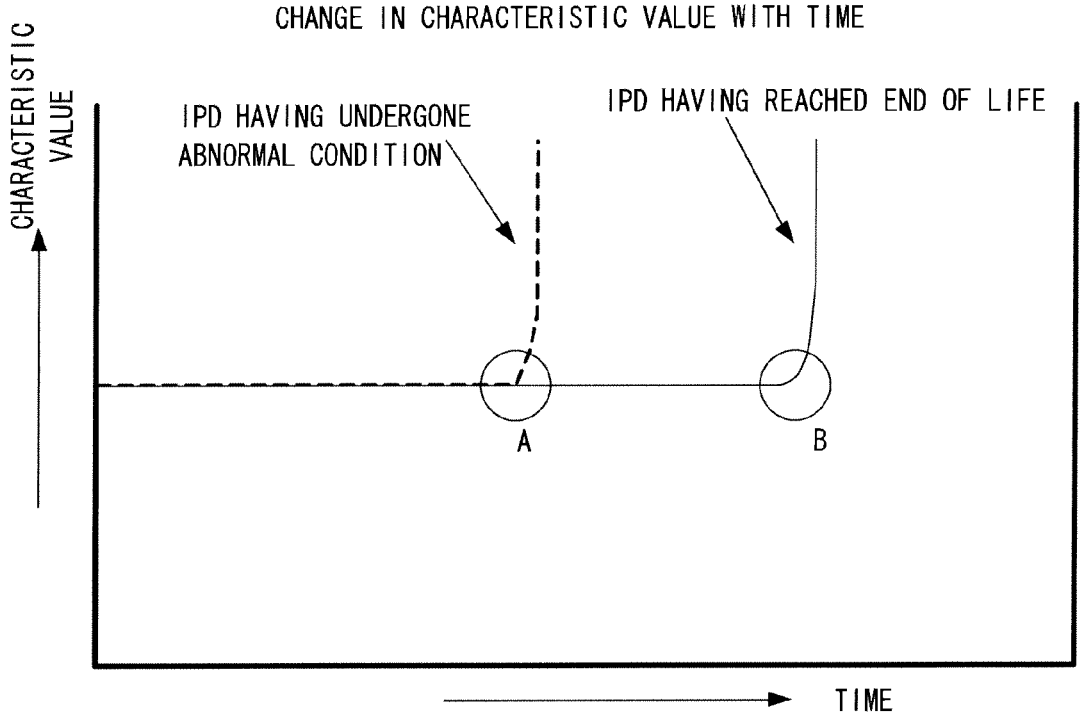
FIG. 12 is a view showing a change in a characteristic value of an IPD with the lapse of time.
Figure 13:
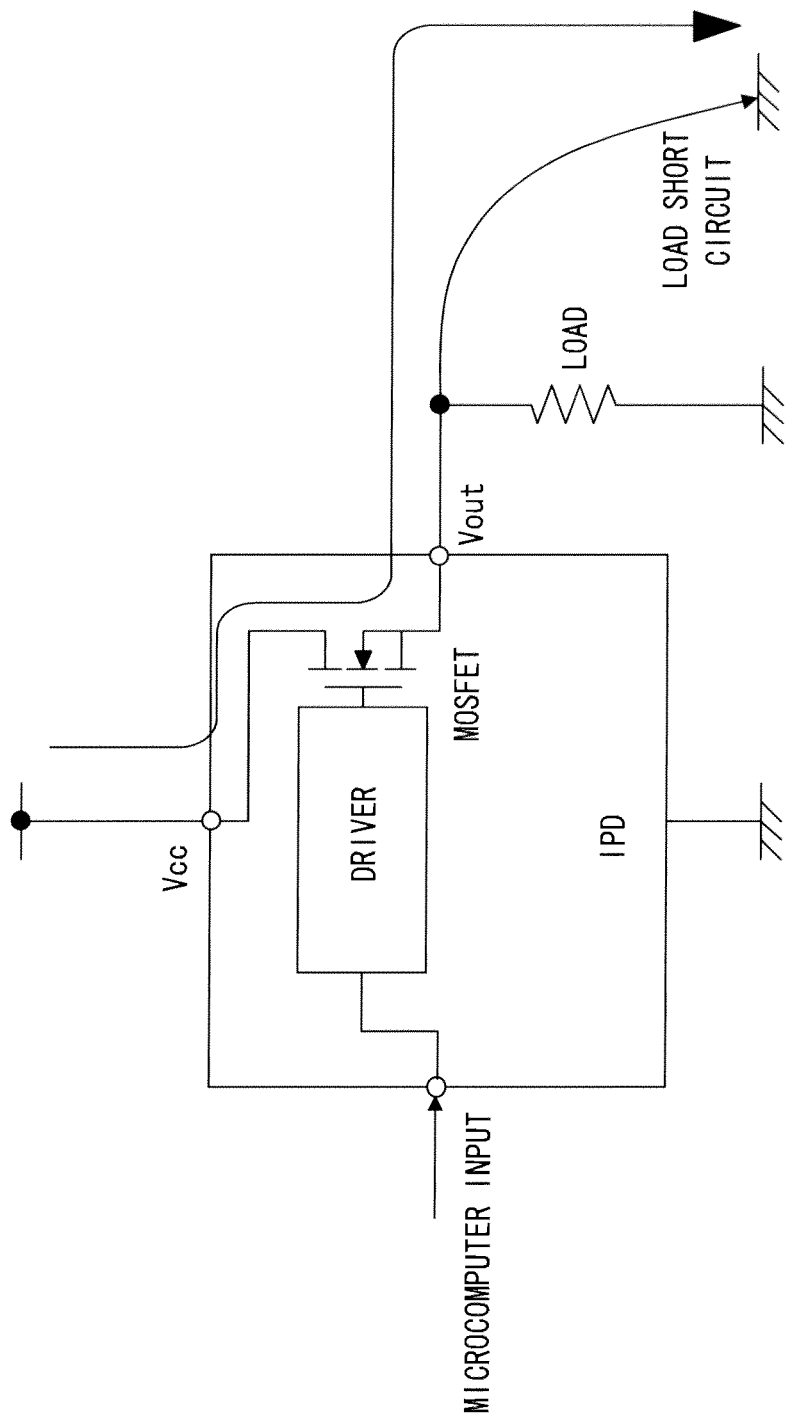
FIG. 13 is a view showing a state where an over-current flows to a power MOSFET due to a load short circuit.
Figure 14:
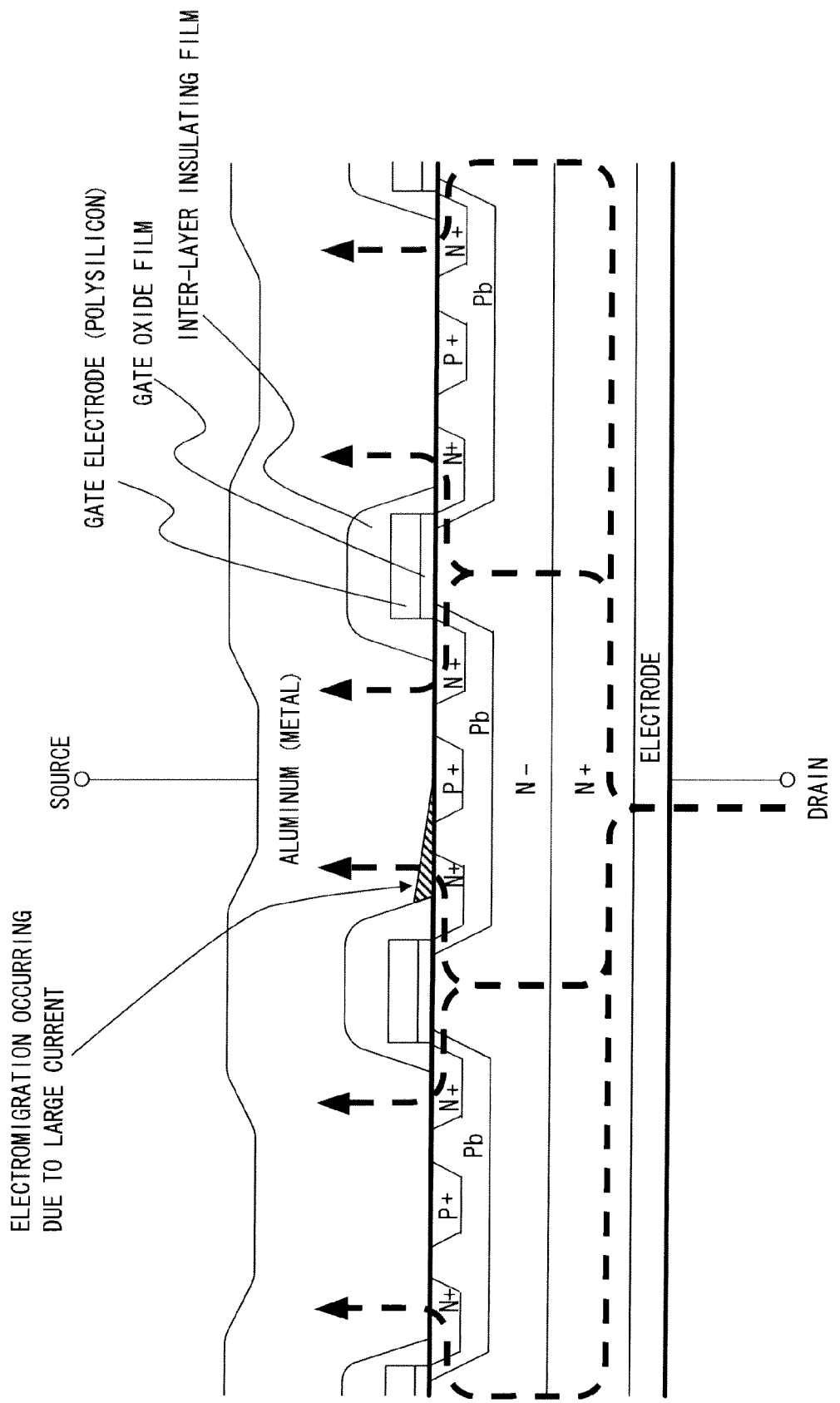
FIG. 14 is a partial cross-sectional view showing a state where electromigration occurs in a power MOSFET.
Figure 15:
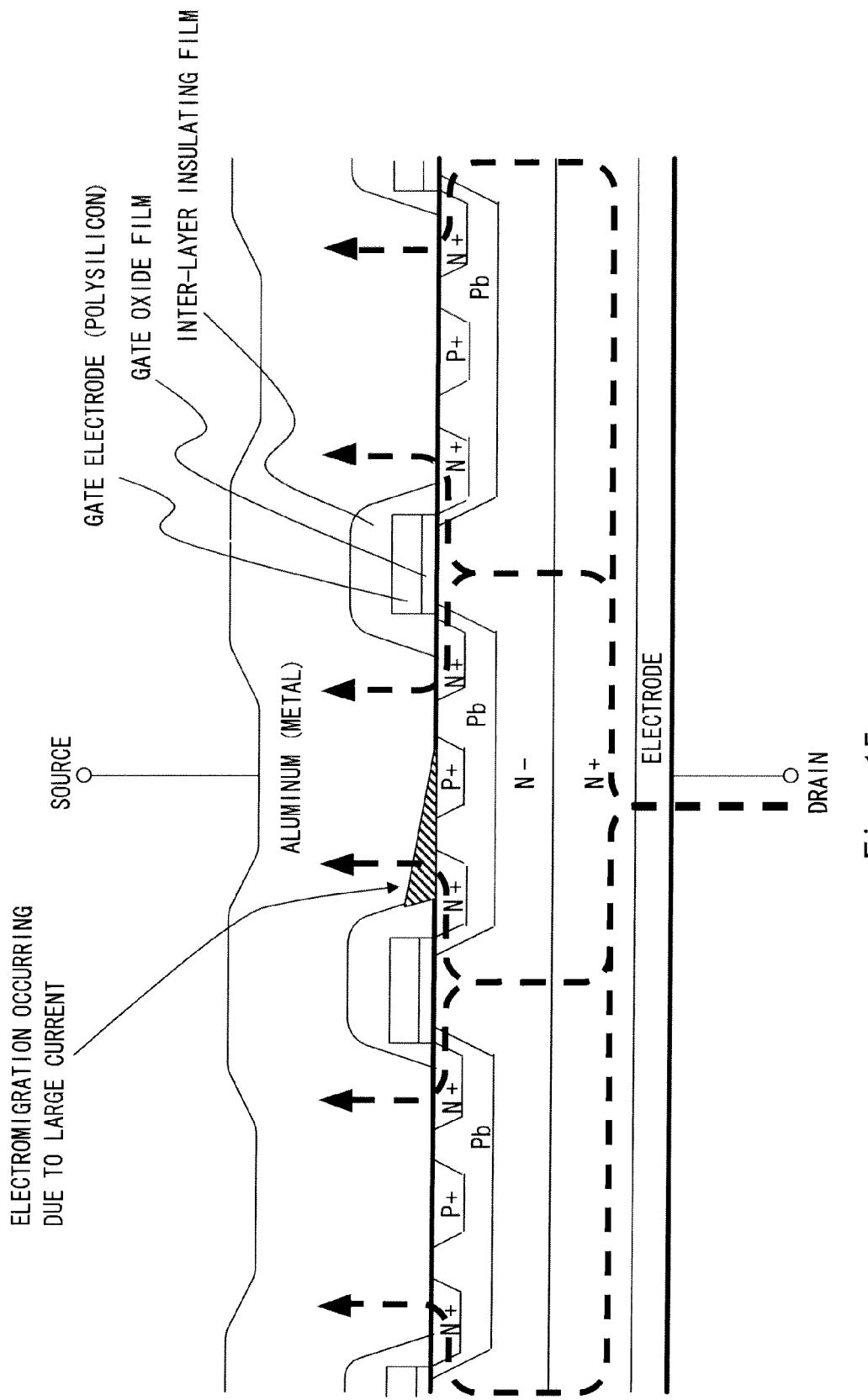
FIG. 15 is a partial cross-sectional view showing a state where electromigration occurs in a power MOSFET.
Figure 16:
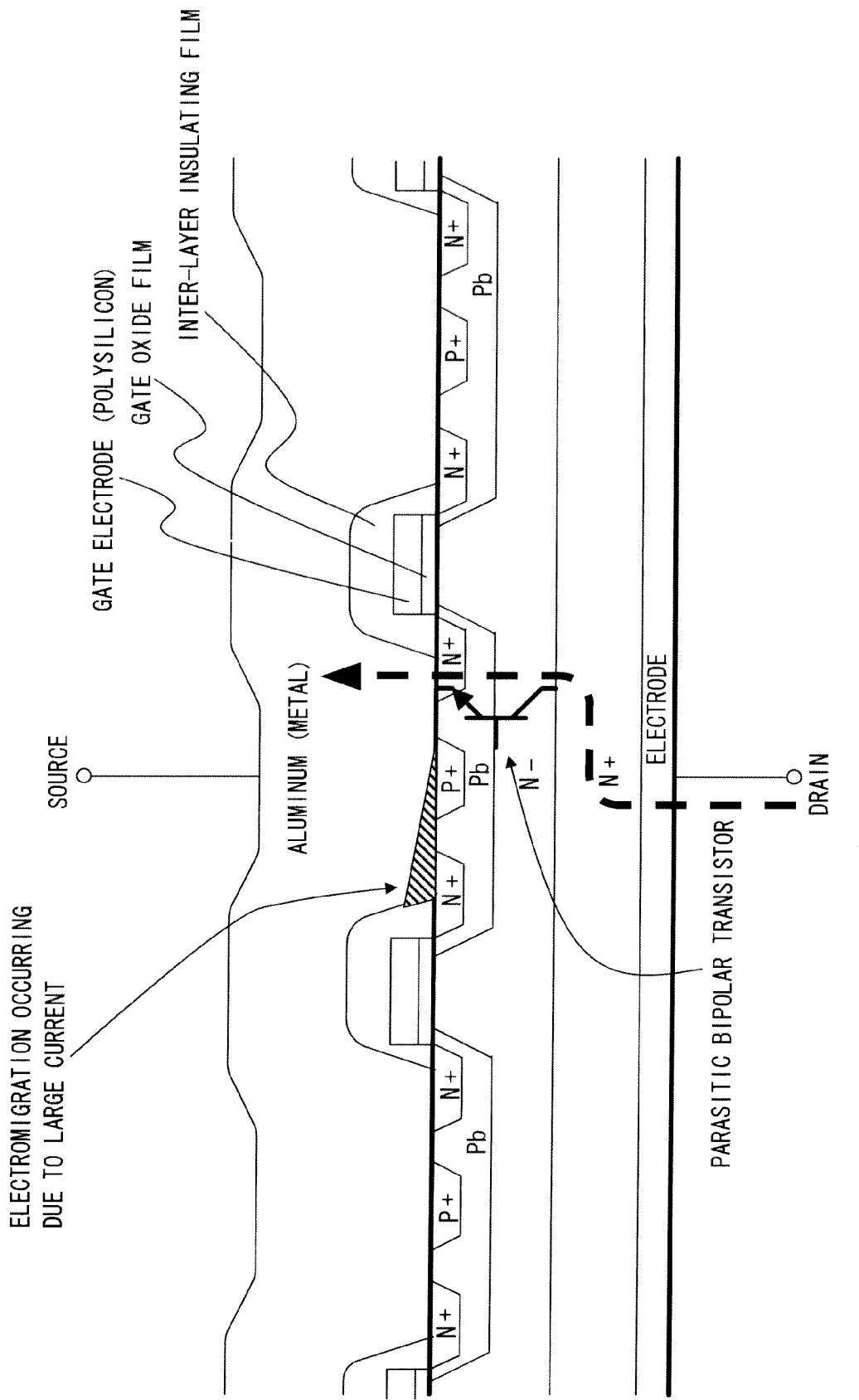
FIG. 16 is a partial cross-sectional view showing a state where a parasitic bipolar transistor is formed in a power MOSFET.
Figure 17:
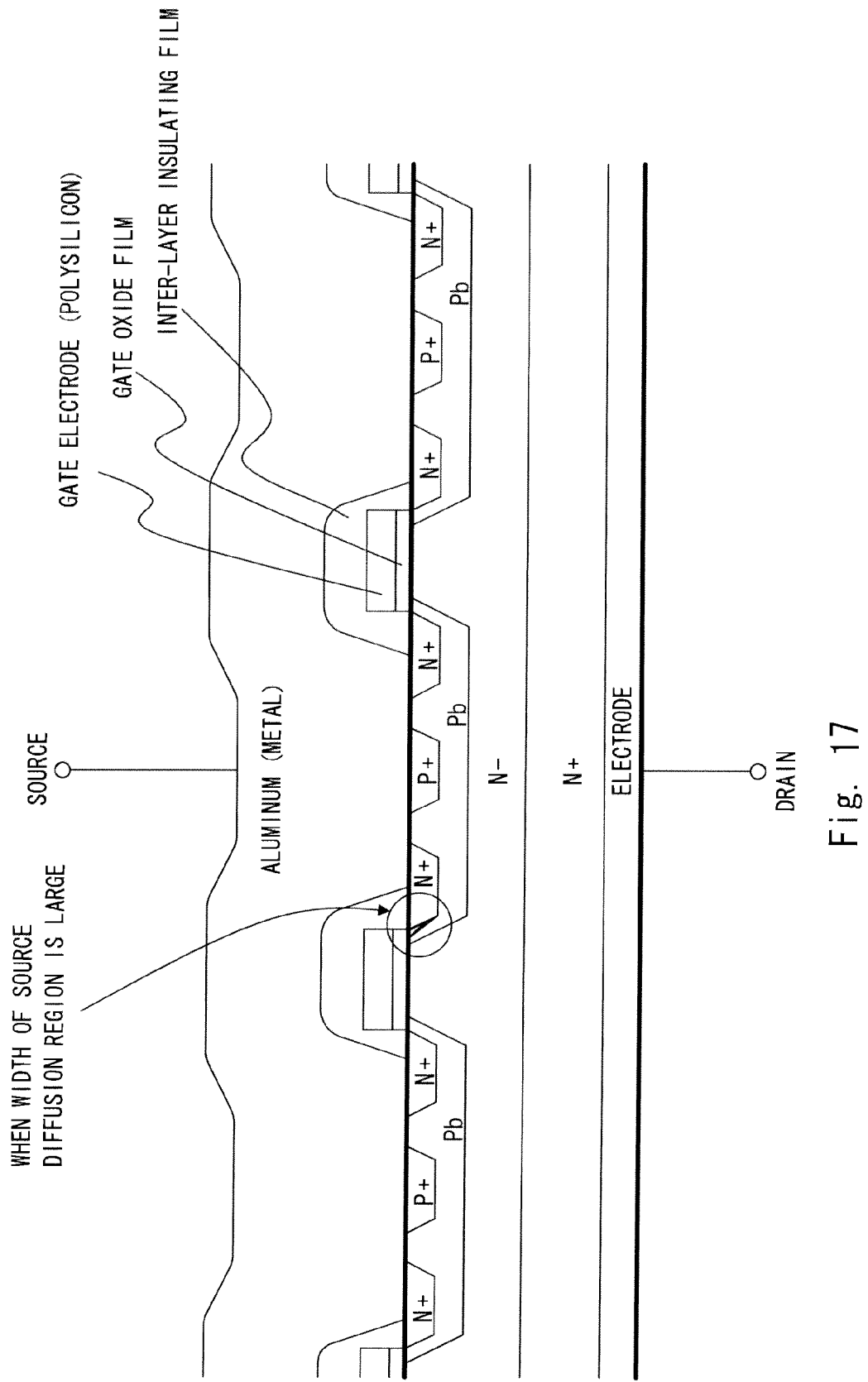
FIG. 17 is a partial cross-sectional view showing a case where the width of a source diffusion region of a power MOSFET is large.
Figure 18:
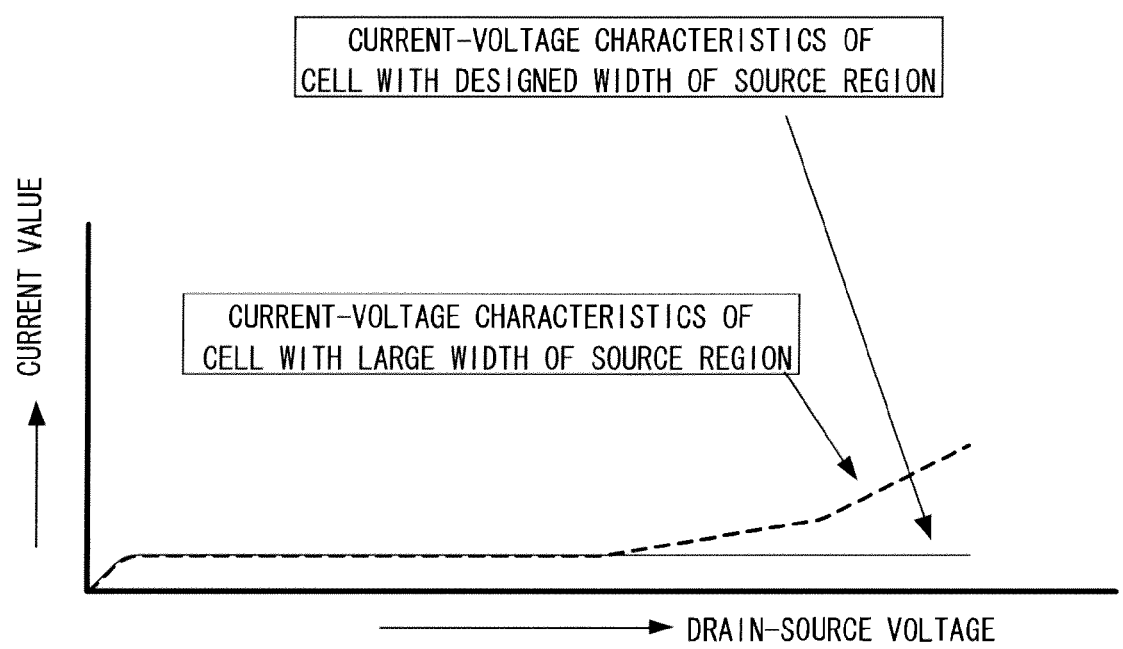
FIG. 18 is a view showing a relationship between a drain-source voltage and a current value in a case where the width of a source diffusion region of a power MOSFET is large.
Figure 19:
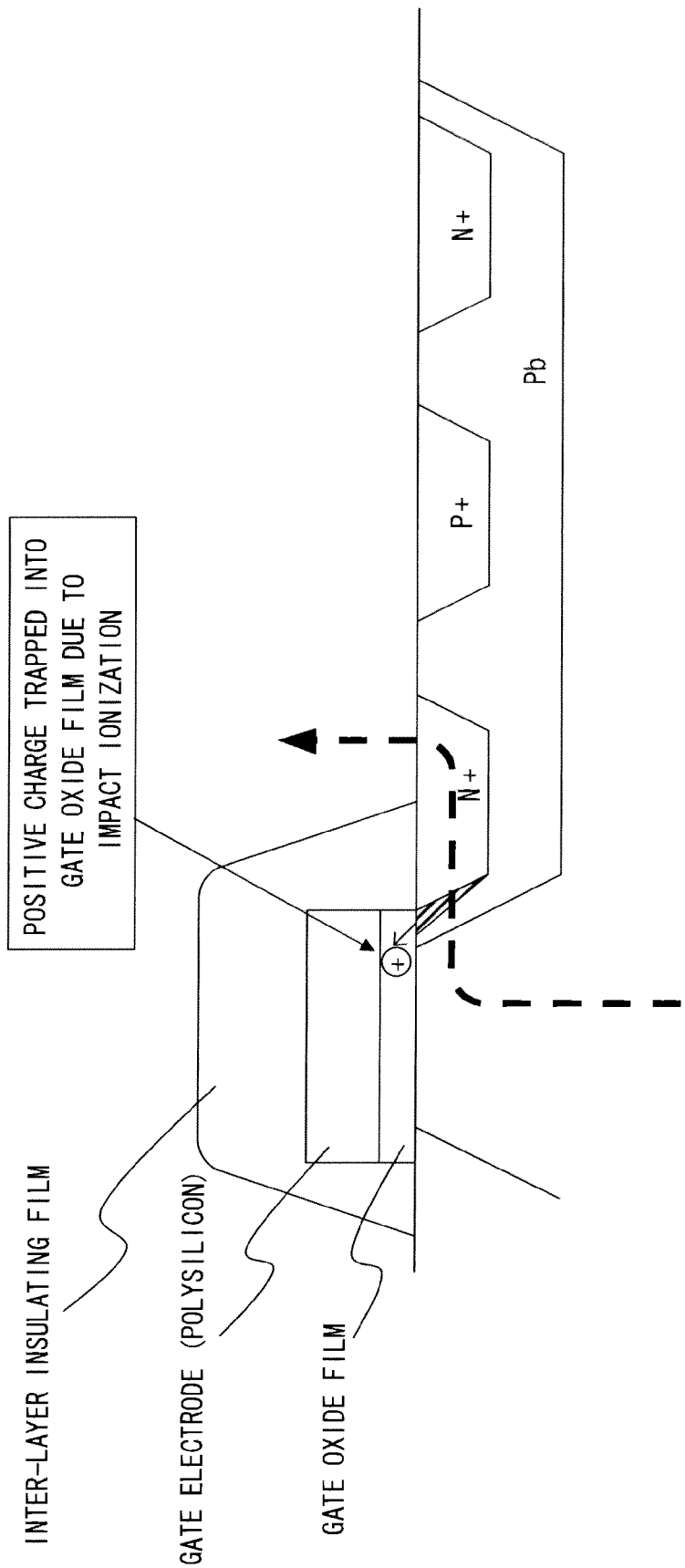
FIG. 19 is a partial cross-sectional view showing a case where positive charges are trapped into a gate oxide film of a power MOSFET.
Figure 20:
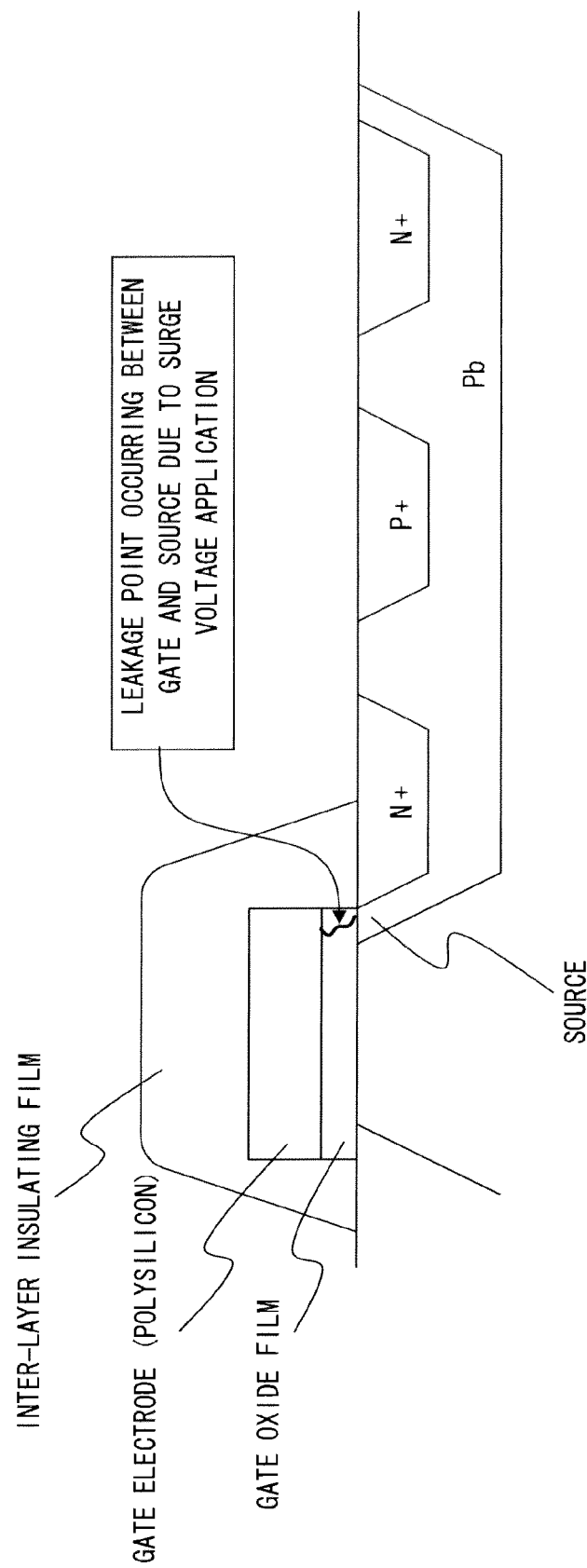
FIG. 20 is a partial cross-sectional view showing a case where a leakage point occurs between a gate and a source of a power MOSFET due to surge voltage application.
Figure 21:
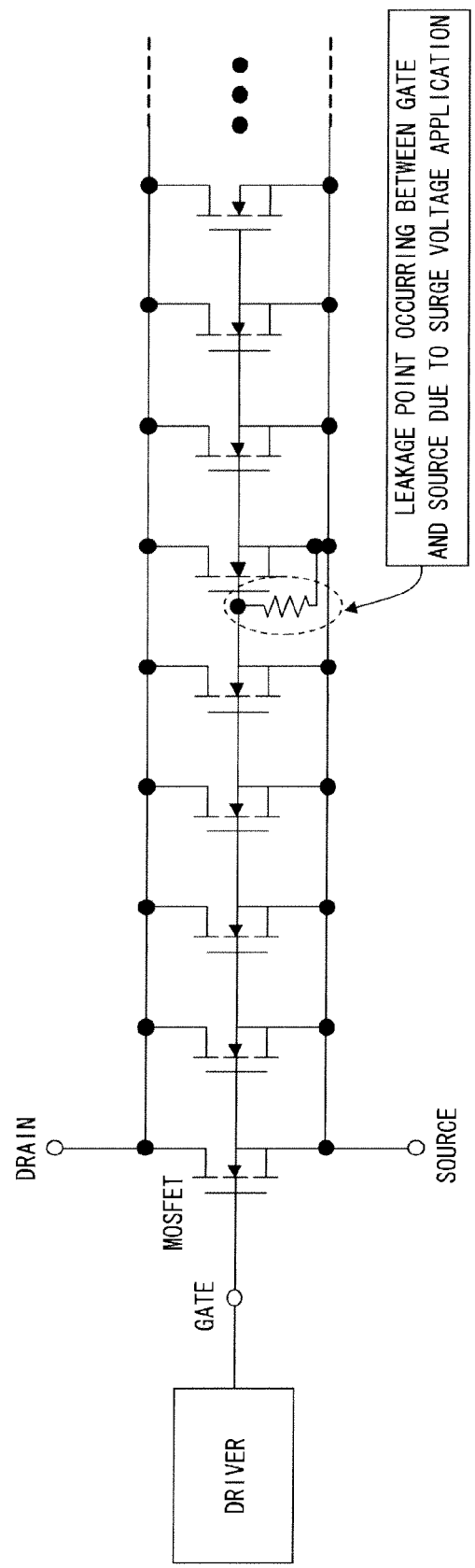
FIG. 21 is an equivalent circuit diagram in a case where a leakage point occurs between a gate and a source of a power MOSFET.
Figure 22:
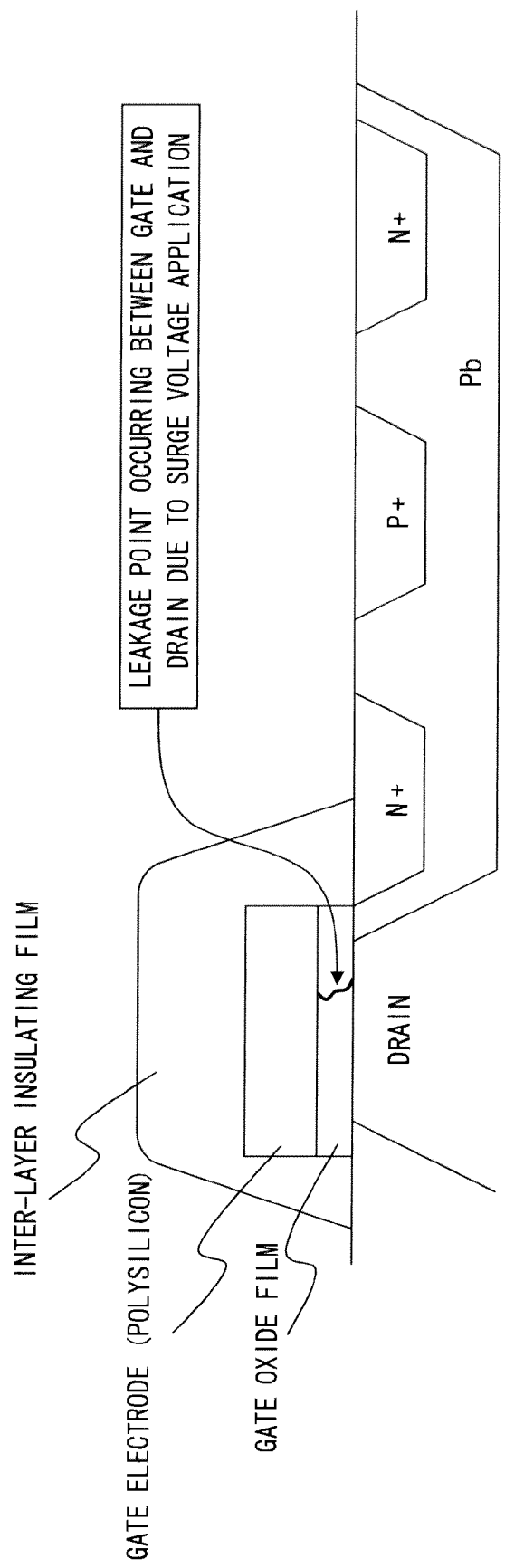
FIG. 22 is a partial cross-sectional view showing a case where a leakage point occurs between a gate and a drain of a power MOSFET due to surge voltage application.
Figure 23:
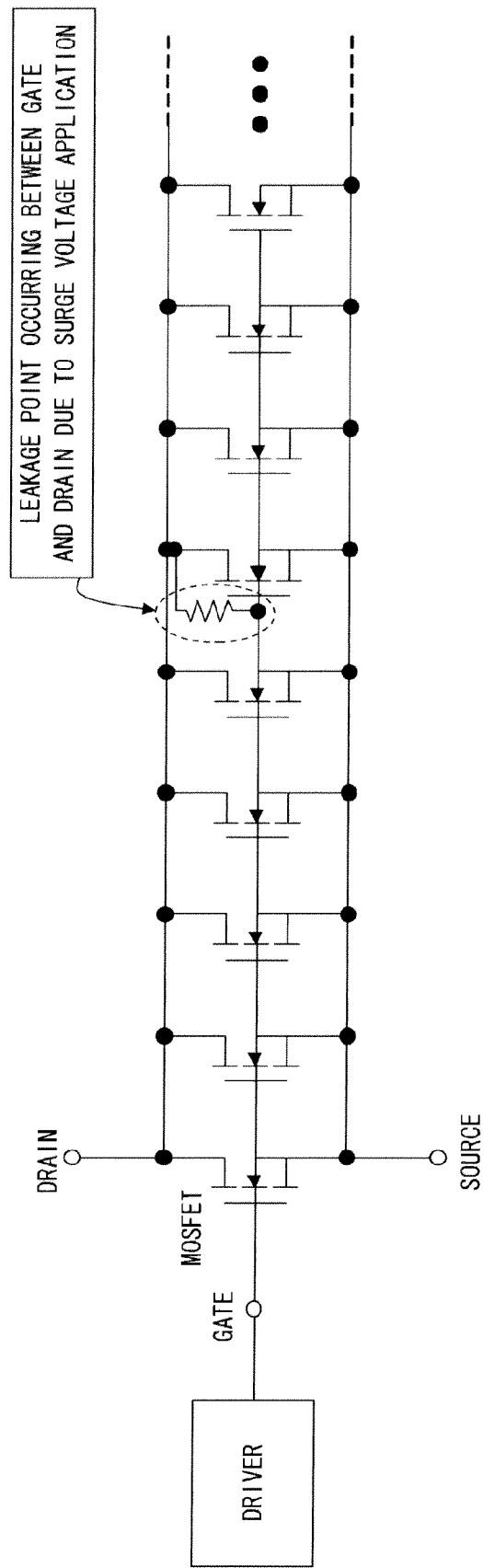
FIG. 23 is an equivalent circuit diagram in a case where a leakage point occurs between a gate and a drain of a power MOSFET.
Figure 24A:
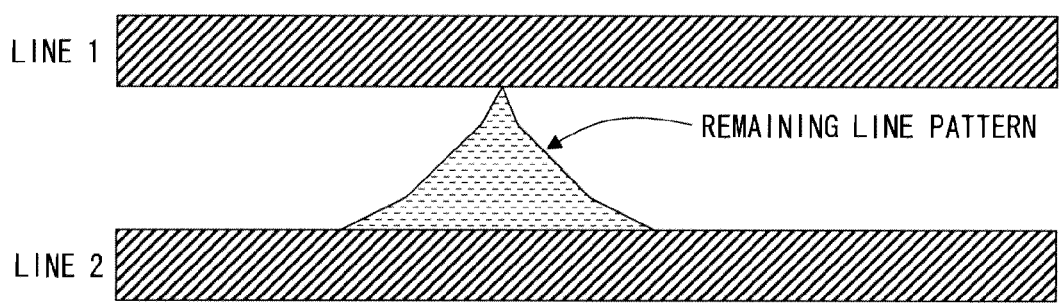
FIG. 24A is a partial plan view showing a case where there is a remaining line pattern between line patterns (between a line 1 and a line 2) of a controller of an IPD.
Figure 24B:
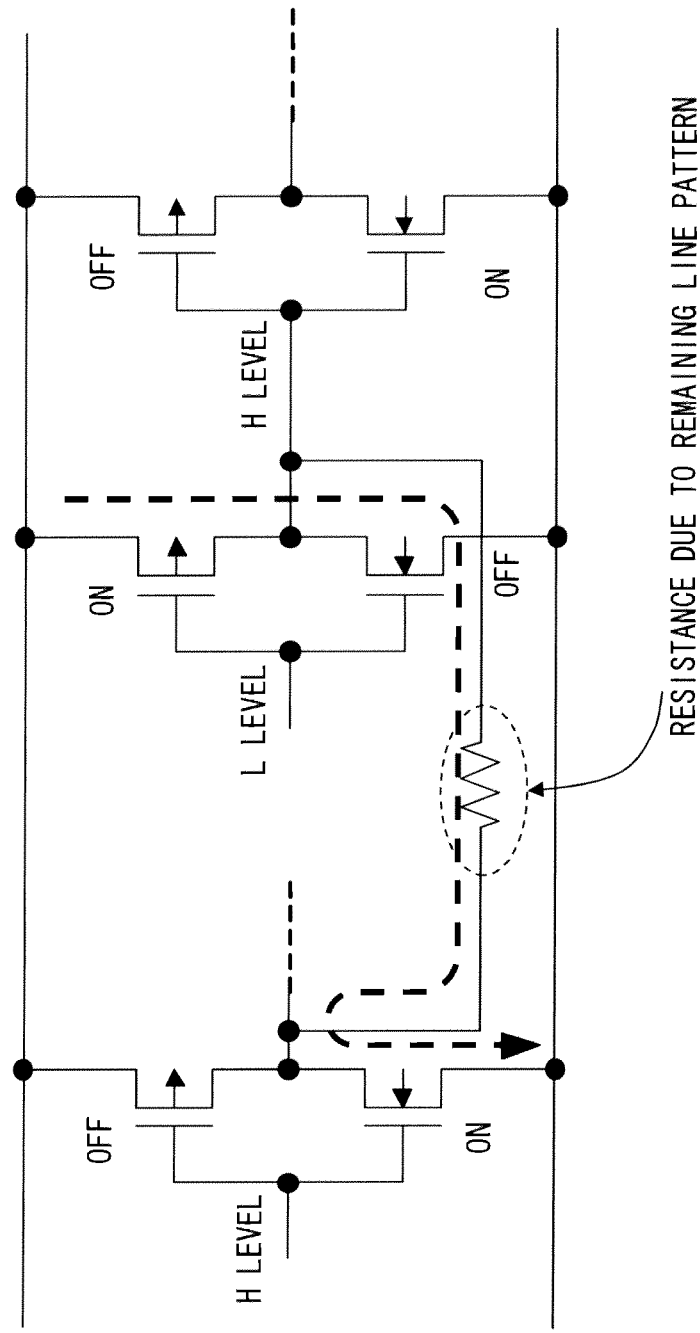
FIG. 24B is a circuit diagram in a case where line patterns (a line 1 and a line 2) are short-circuited.
Figure 25:
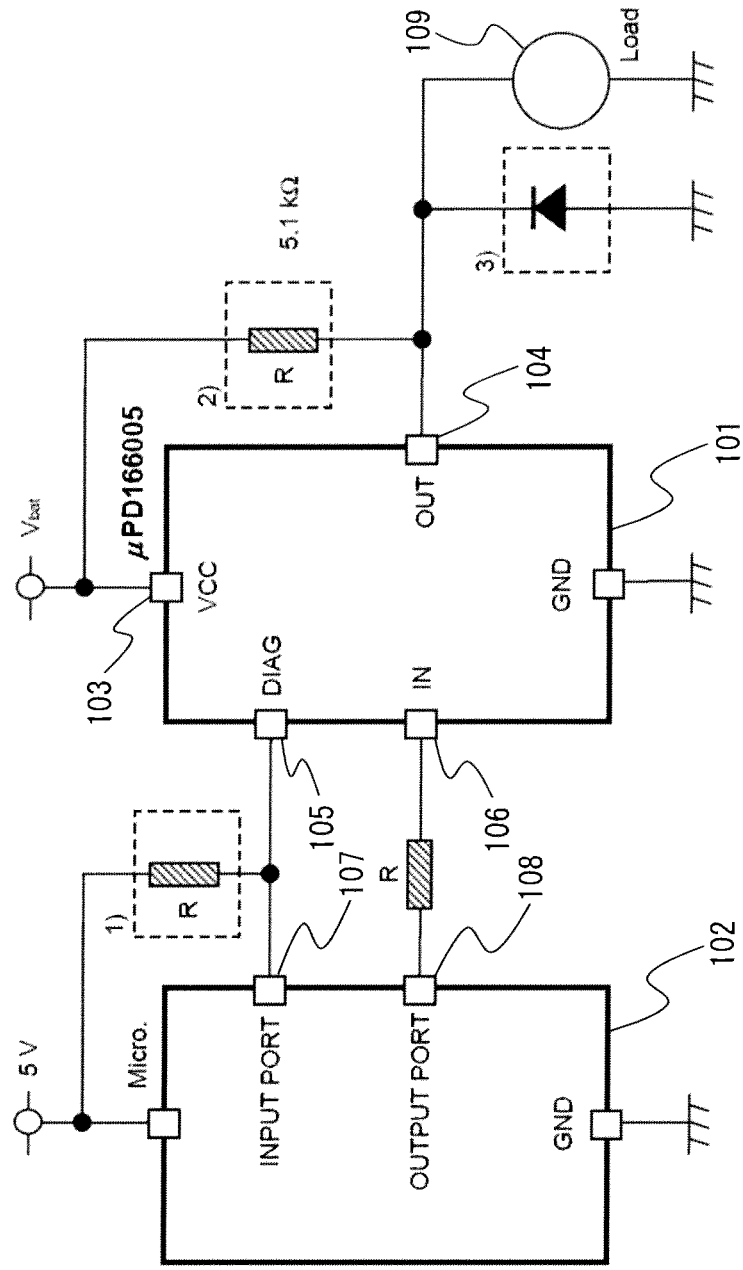
FIG. 25 is a block diagram showing an exemplary circuit that incorporates an intelligent power device (IPD) according to prior art.
Figure 26:
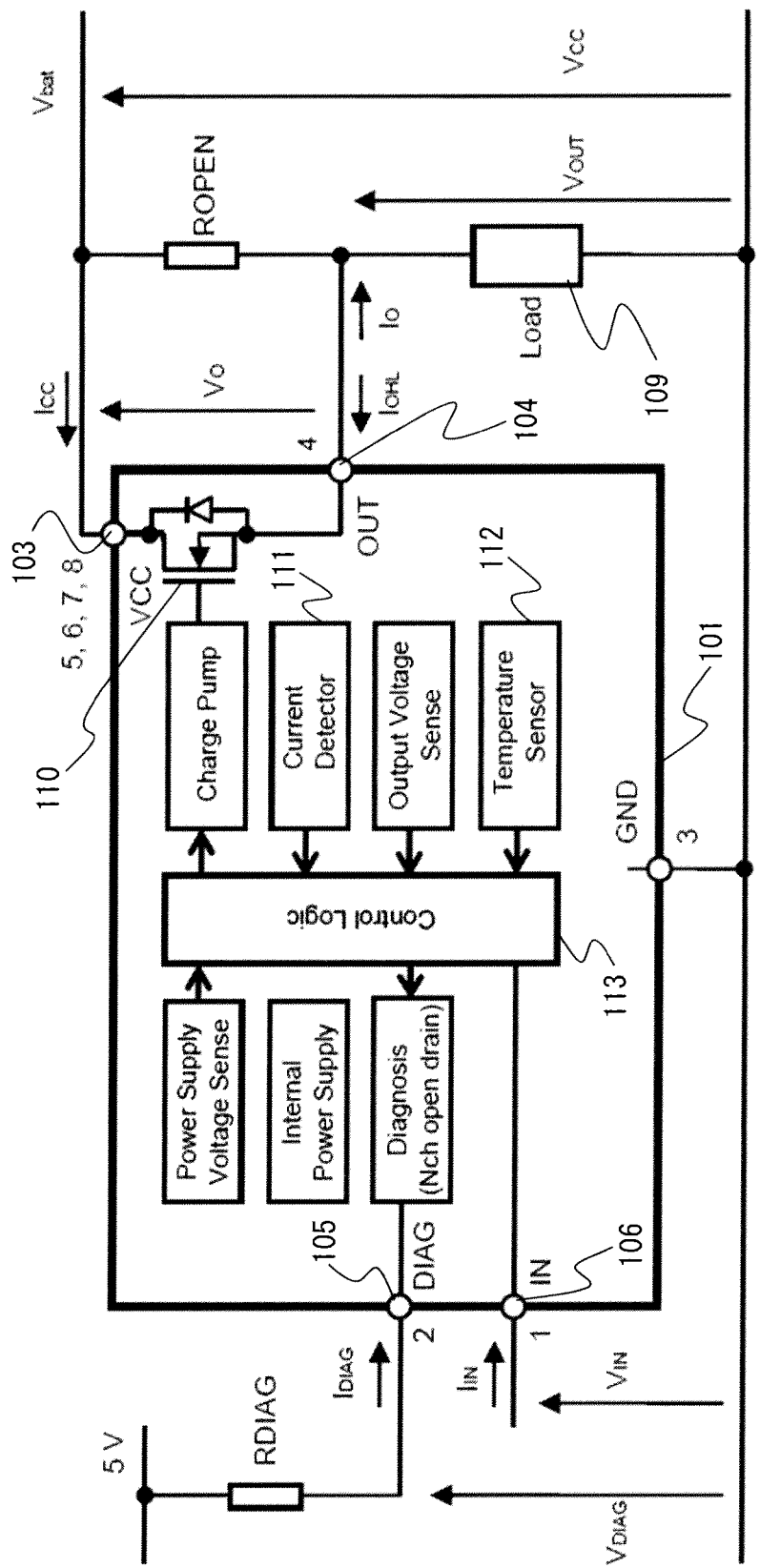
FIG. 26 is a block diagram of an IPD according to prior art.
Figure 27A:
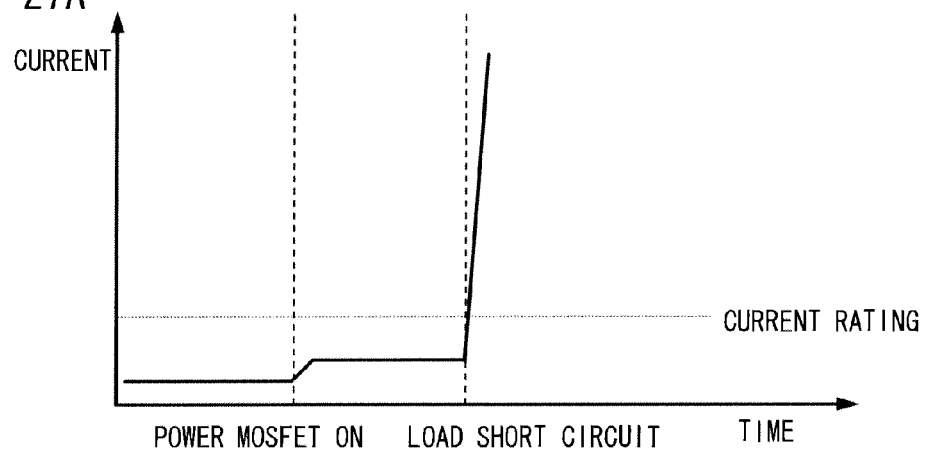
FIGS. 27A to 27C are views showing a change in an output current of a power MOSFET when the power MOSFET turns on and then a load short circuit occurs in an IPD according to background art, specifically.
Figure 27B:
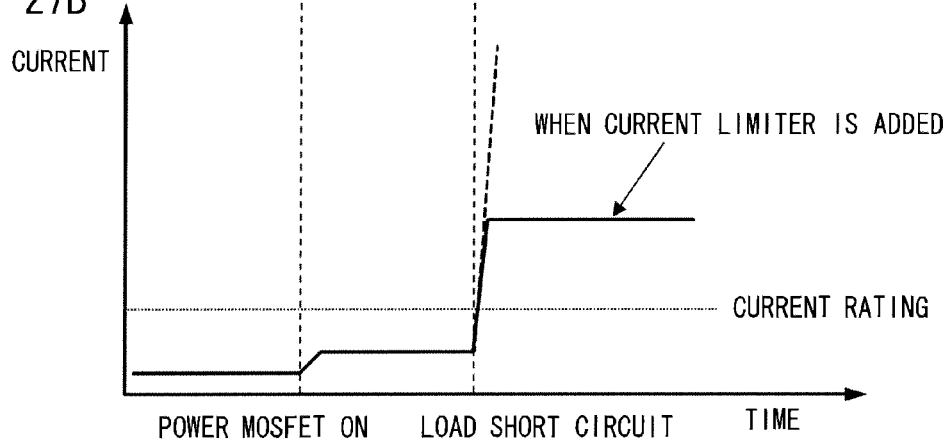
Figure 27C:
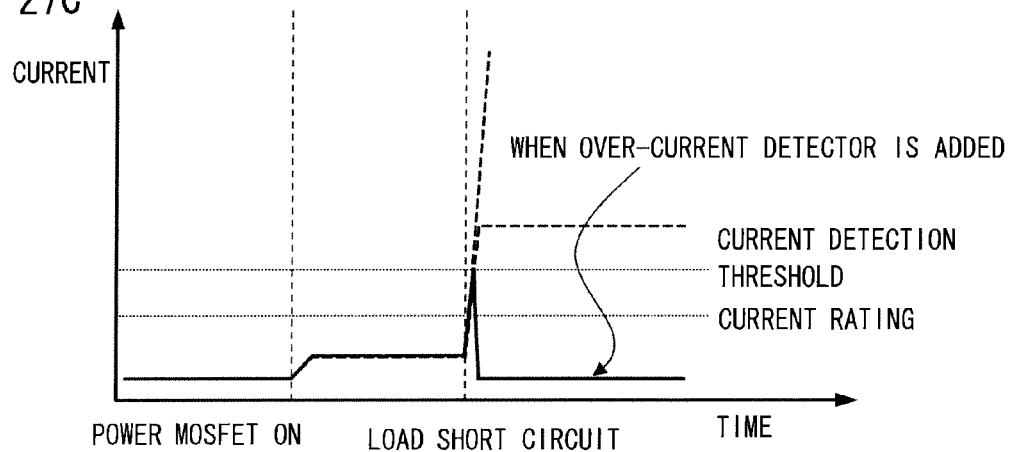
Figure 28:
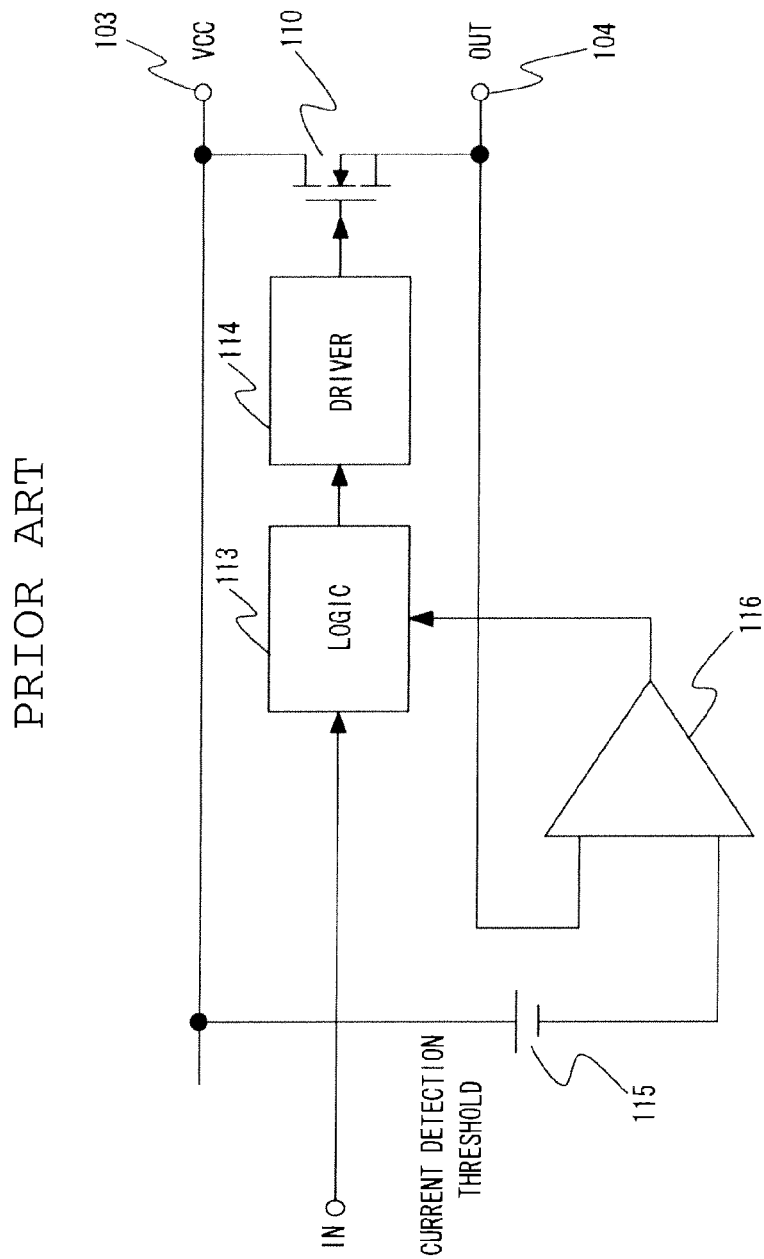
FIG. 28 is a circuit diagram showing an example of an over-current detector.
Figure 29A:
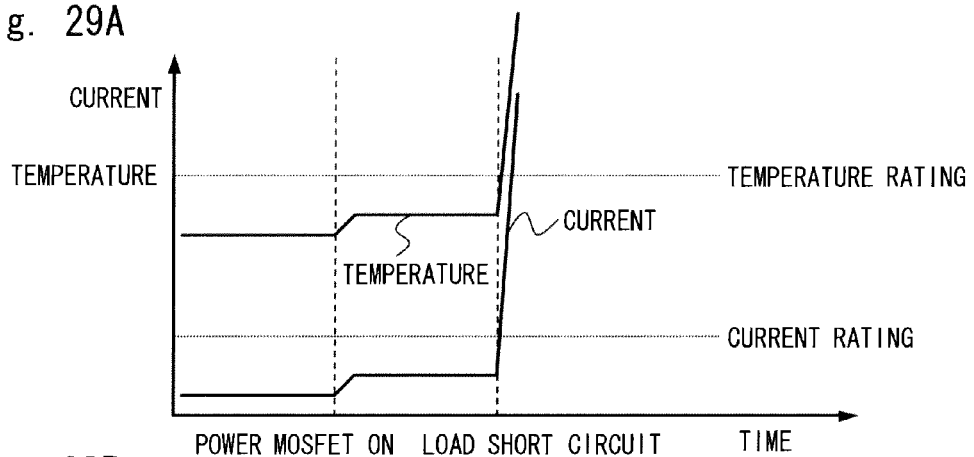
FIGS. 29A to 29C are views showing a change in an output current and a temperature of a power MOSFET when the power MOSFET turns on and then a load short circuit occurs in an IPD according to background art, specifically.
Figure 29B:
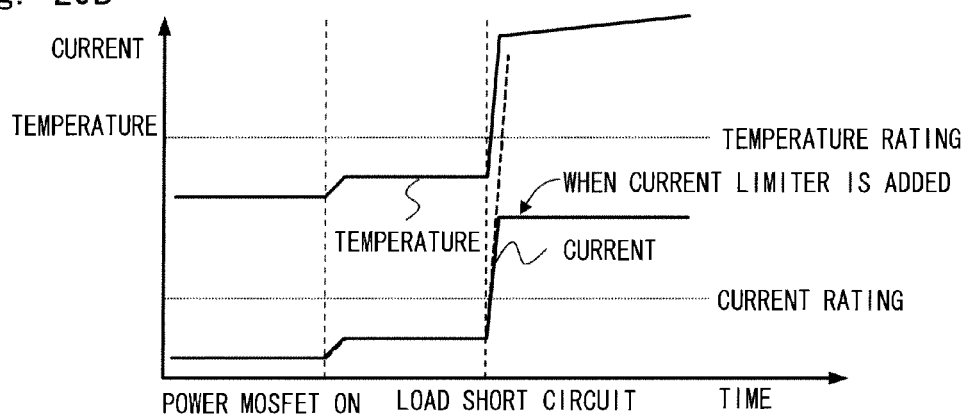
Figure 29C:
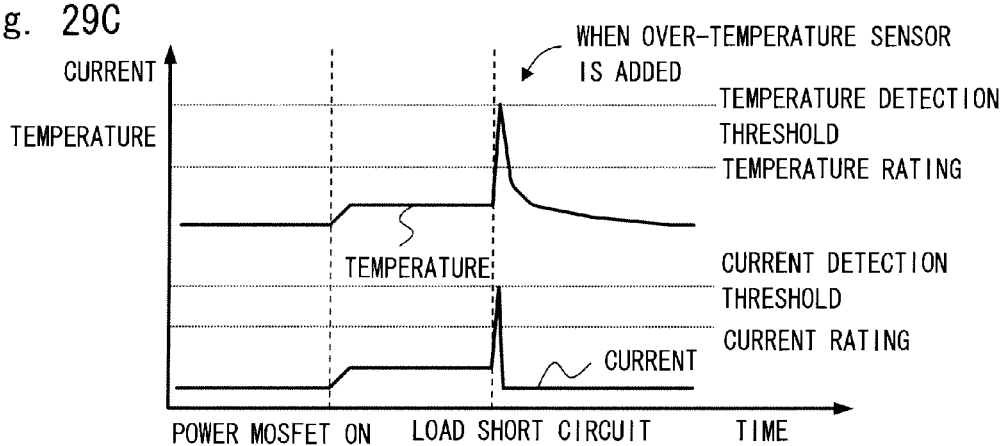
Figure 30:
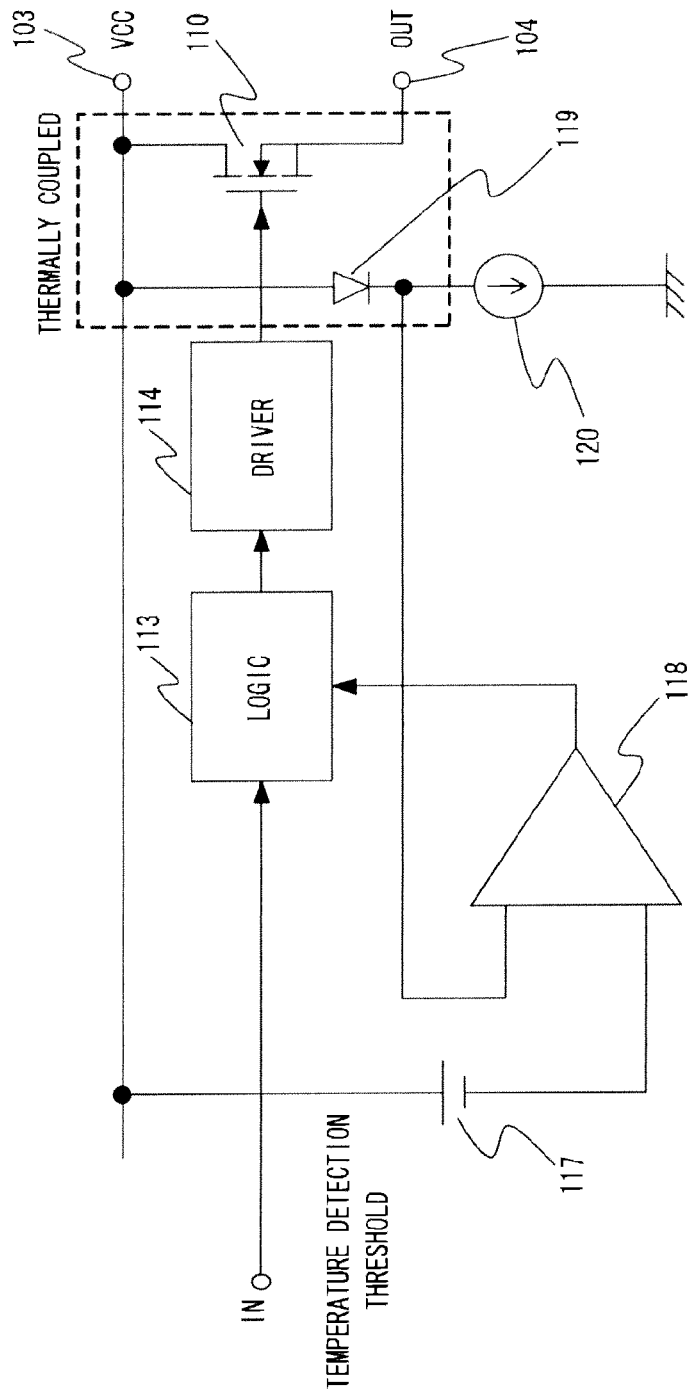
FIG. 30 is a circuit diagram showing an example of an over-temperature sensor.

A flow from manufacture to abnormality detection of the semiconductor apparatus according to the exemplary embodiment is described hereinafter with reference to FIG. 10. First, the intelligent power device (IPD) which is the semiconductor apparatus according to the exemplary embodiment is manufactured (Step S11). Next, the initial characteristics of the IPD 1a are measured, and the set values (the first set value and the second set value) determined based on the initial characteristic value are recorded (Step S12). When recording the set values, the values of the resistance values Ra1 to Ra4 described above are used as the set value, for example. Then, the IPD 1a is installed into a system such as an engine control unit (ECU) (Step S13). After that, the power of the IPD 1a is turned on (Step S14). When the IPD 1a is powered on, the performance of the IPD 1a is measured (Step S15). Specifically, in the IPD 1a, the on-resistance detector 20, the gate leakage detector 30, the off-leakage detector 40 and the consumption current detector 50 measure the characteristic values of the IPD 1a.

Then, the respective characteristic values of the IPD 1a measured in Step S15 are compared with the initial value (the set value determined based on the initial characteristic value) (Step S16). It is then determined on the basis of the first set value whether there is a problem in the characteristic values measured in Step S15 (Step S17). It is further determined on the basis of the second set value whether there is a significant problem in the characteristic values measured in Step S15 (Step S18). When the characteristic values measured in Step S15 are outside the allowable range of the second set value, which is when there is a significant problem, the IPD 1a instructs the controller (microcomputer) to perform self-diagnosis (Step S22) and turns off the power of the IPD 1a to stop the operation of the IPD 1a (Step S23). Further, when the characteristic values measured in Step S15 are within the allowable range of the second set value, which is when there is no significant problem, the IPD 1a outputs a warning to the controller of the IPD 1a (Step S21).

After Steps S22 and S23, a message notifying the necessity of an inspection of the IPD 1a is output from the controller (Step S24). Specifically, a message that recommends an inspection to a driver, an automobile dealer or the like is output from the microcomputer 10, which is the controller. By the message, an inspection of a system (automobile) is encouraged, and adjustment or repairer is performed in an automobile repair shop or the like (Step S25). This avoids a breakdown of the IPD 1a and enables the safe operation of the system.

On the other hand, when there is no problem in the characteristic values measured in Step S15, and after the warning is output to the controller in Step S21, the IPD 1a is made to operate (Step S19). After that, when a control signal for turning off the IPD1a is supplied from the input terminal 7, the power of the IPD 1a is turned off (Step S20), the process proceeds to Step S14 and then repeats the operation from Step S14.

As described above, in the IPD 1a according to the exemplary embodiment, the characteristic degradation which leads to a failure of the IPD 1a can be detected based on the set value determined based on the initial characteristic value of the IPD 1a and the characteristic value of the IPD 1a at given timing, and it is thereby possible to prevent a failure of the IPD 1a from occurring.

Particularly, in the IPD 1a according to the exemplary embodiment, two values are used as the set values determined based on the initial characteristic value of the IPD 1a, and when the set value (the second set value) which is close to a breakdown of the IPD 1a is satisfied, the operation of the IPD 1a is stopped, and it is thereby possible to prevent runaway of the load due to a failure of the IPD 1a.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor apparatus comprising:
   a set value storage unit that stores a set value determined based on a characteristic value of a parameter of the semiconductor apparatus at an initial timing; and
   a detector that detects characteristic degradation of the semiconductor apparatus based on detecting the characteristic value of the parameter of the semiconductor apparatus at a given timing after the initial timing and the set value stored in the set value storage unit,
   wherein the detector is an on-resistance detector that detects an on-resistance of a semiconductor device that is included in the semiconductor apparatus,
   wherein the on-resistance detector includes:
   a first resistor having one end connected to a source of the semiconductor device at a first node and another end connected to a second node;
   a first variable resistor having one end connected to a drain of the semiconductor device and another end connected to a third node;
   a second resistor having one end connected to the third node and another end connected to the second node; and
   a first comparator that receives a voltage value of the first node and a voltage value of the third node, and outputs a signal based on a potential difference between the voltage value of the first node and the voltage value of the third node.

2. A semiconductor apparatus comprising:
   a set value storage unit that stores a set value determined based on a characteristic value of a parameter of the semiconductor apparatus at an initial timing; and
   a detector that detects characteristic degradation of the semiconductor apparatus based on detecting the characteristic value of the parameter of the semiconductor apparatus at a given timing after the initial timing and the set value stored in the set value storage unit,
   wherein the detector is a gate leakage detector that detects a gate leakage of a semiconductor device that is included in the semiconductor apparatus,
   wherein the gate leakage detector includes:
   a third resistor connected to a gate of the semiconductor device;
   a first operational amplifier that receives a potential difference between both ends of the third resistor and outputs a voltage signal based on the potential difference; and
   a second comparator that receives the voltage signal of the first operational amplifier and a reference voltage, and outputs a signal based on a comparison result between the voltage signal of the first operational amplifier and the reference voltage.

3. A semiconductor apparatus comprising:
   a set value storage unit that stores a set value determined based on a characteristic value of a parameter of the semiconductor apparatus at an initial timing; and
   a detector that detects characteristic degradation of the semiconductor apparatus based on detecting the characteristic value of the parameter of the semiconductor apparatus at a given timing after the initial timing and the set value stored in the set value storage unit,
   wherein the detector is a consumption current detector that detects a consumption current of the semiconductor apparatus,
   wherein the consumption current detector includes:
   a fourth resistor connected to an internal reference line of the semiconductor apparatus;
   a second operational amplifier that receives a potential difference between both ends of the fourth resistor, and outputs a voltage signal based on the potential difference; and
   a third comparator that receives the voltage signal of the second operational amplifier and a reference voltage, and outputs a signal based on a comparison result between the voltage signal of the second operational amplifier and the reference voltage.

4. The semiconductor apparatus according to claim 2, wherein the reference voltage is set by using a circuit including a first constant voltage source, and a second variable resistor and a fifth resistor that divides a voltage of the first constant voltage source.

5. A semiconductor apparatus comprising:
   a set value storage unit that stores a set value determined based on a characteristic value of a parameter of the semiconductor apparatus at an initial timing; and
   a detector that detects characteristic degradation of the semiconductor apparatus based on detecting the characteristic value of the parameter of the semiconductor apparatus at a given timing after the initial timing and the set value stored in the set value storage unit,
   wherein the detector is an off-leakage detector that detects an off-leakage of a semiconductor device,
   wherein the off-leakage detector includes:
   a sixth resistor connected to a source of the semiconductor device;
   a third operational amplifier that receives a potential difference between both ends of the sixth resistor, and outputs a signal based on the potential difference;
   a first transistor having a gate connected to an output of the third operational amplifier and a source connected to a fourth node; and
   a first current mirror having a first current path connected to the fourth node and a second current path connected to a fifth node through which a reference current flows.

6. The semiconductor apparatus according to claim 5, wherein the reference current is set by using a second current mirror having a third current path connected to a second constant voltage source and a third variable resistor and the second current path.

7. The semiconductor apparatus according to claim 1, wherein
   the first variable resistor includes:
   a plurality of resistors connected in series;
   a plurality of P-type transistors respectively corresponding to the plurality of resistors, each having a source and a drain connected to both ends of each of the plurality of resistors;
   a plurality of constant current sources connected to each of gates of the plurality of P-type transistors,
   a plurality of trimming resistors placed between each of the gates of the plurality of P-type transistors and a reference power supply; and a resistance value is set by cutting off the trimming resistors.

8. The semiconductor apparatus according to claim 2, wherein a first set value and a second set value determined based on an initial characteristic value of the semiconductor apparatus are stored in the set value storage unit, the detector detects characteristic degradation of the semiconductor apparatus based on a characteristic value of the parameter of the semiconductor apparatus at a given timing and the first set value, and outputs a warning based on a detection result; and the detector detects characteristic degradation of the semiconductor apparatus based on a characteristic value of the parameter of the semiconductor apparatus at given timing and the second set value, and stops an operation of the semiconductor apparatus based on a detection result.

9. The semiconductor apparatus according to claim 2, wherein the given timing is a timing when power of the semiconductor apparatus is turned on, a timing when a control signal is supplied to an input terminal of the semiconductor apparatus, a timing when an instruction signal for detecting characteristic degradation of the semiconductor apparatus is supplied from a controller that controls the semiconductor apparatus to the semiconductor apparatus, or a timing at regular time intervals during an operation of the semiconductor apparatus.

10. The semiconductor apparatus according to claim 3, wherein the reference voltage is set by using a circuit including a first constant voltage source, and a second variable resistor and a fifth resistor that divides a voltage of the first constant voltage source.

* * * * *